(12) United States Patent
Fujii et al.

(10) Patent No.: US 9,236,381 B2
(45) Date of Patent: Jan. 12, 2016

(54) NONVOLATILE MEMORY ELEMENT, NONVOLATILE MEMORY APPARATUS, NONVOLATILE SEMICONDUCTOR APPARATUS, AND METHOD OF MANUFACTURING NONVOLATILE MEMORY ELEMENT

(75) Inventors: Satoru Fujii, Osaka (JP); Takeshi Takagi, Kyoto (JP); Shunsaku Muraoka, Osaka (JP); Koichi Osano, Osaka (JP); Kazuhiko Shimakawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 132 days.

(21) Appl. No.: 12/307,032

(22) PCT Filed: Oct. 24, 2007

(86) PCT No.: PCT/JP2007/070751
§ 371 (c)(1),
(2), (4) Date: Mar. 11, 2009

(87) PCT Pub. No.: WO2008/059701
PCT Pub. Date: May 22, 2008

(65) Prior Publication Data
US 2009/0224224 A1    Sep. 10, 2009

(30) Foreign Application Priority Data

Nov. 17, 2006   (JP) ................................. 2006-311910

(51) Int. Cl.
*H01L 47/00* (2006.01)
*H01L 27/10* (2006.01)
(Continued)

(52) U.S. Cl.
CPC .......... *H01L 27/101* (2013.01); *G11C 13/0007* (2013.01); *H01L 27/2418* (2013.01);
(Continued)

(58) Field of Classification Search
CPC ..................................................... H01L 27/101
See application file for complete search history.

(56) References Cited

U.S. PATENT DOCUMENTS 6,917,539 B2 *   7/2005   Rinerson et al. ............... 365/171
7,061,808 B2 *   6/2006   Yaoi et al. ................. 365/185.19
(Continued)

FOREIGN PATENT DOCUMENTS

JP   07-263647   10/1995
JP   H09-166792   6/1997
(Continued)

OTHER PUBLICATIONS

Baek, I.G., et al., "Highly Scalable Non-volatile Resistive Memory using Simple Binary Oxide Driven by Asymmetric Unipolar Voltage Pulses", Tech. Digest IEDM, 2004.
(Continued)

*Primary Examiner* — Jerome Jackson, Jr.
(74) *Attorney, Agent, or Firm* — McDermott Will & Emery LLP

(57) ABSTRACT

A nonvolatile memory element of the present invention comprises a first electrode (103), a second electrode (105), and a resistance variable layer (104) disposed between the first electrode (103) and the second electrode (104), a resistance value of the resistance variable layer varying reversibly according to an electric signal applied between the electrodes (103), (105), and the resistance variable layer (104) comprises at least a tantalum oxide, and is configured to satisfy $0<x<2.5$ when the tantalum oxide is represented by $TaO_x$.

25 Claims, 25 Drawing Sheets

(51) Int. Cl.
- *G11C 13/00* (2006.01)
- *H01L 27/24* (2006.01)
- *H01L 45/00* (2006.01)

(52) U.S. Cl.
CPC ........ *H01L27/2436* (2013.01); *H01L 27/2481* (2013.01); *H01L 45/08* (2013.01); *H01L 45/1233* (2013.01); *H01L 45/146* (2013.01); *H01L 45/1625* (2013.01); *G11C 2213/32* (2013.01); *G11C 2213/34* (2013.01); *G11C 2213/71* (2013.01); *G11C 2213/72* (2013.01); *G11C 2213/79* (2013.01)

(56) References Cited

U.S. PATENT DOCUMENTS

| | | |
|---|---|---|
| 2004/0159867 A1 | 8/2004 | Kinney et al. |
| 2005/0201187 A1 | 9/2005 | Hofmann et al. |
| 2005/0243595 A1 | 11/2005 | Rinerson et al. |
| 2007/0291441 A1 | 12/2007 | Inoue et al. |
| 2008/0211011 A1 | 9/2008 | Takashima et al. |
| 2010/0133501 A1 | 6/2010 | Sakamoto et al. |

FOREIGN PATENT DOCUMENTS

| | | |
|---|---|---|
| JP | 2001-164360 A | 6/2001 |
| JP | 2002-537627 | 11/2002 |
| JP | 2004-228355 A | 8/2004 |
| JP | 2004-349689 | 12/2004 |
| JP | 2004-363604 | 12/2004 |
| JP | 2005-317787 A | 11/2005 |
| JP | 2005-347468 | 12/2005 |
| JP | 2006-032898 | 2/2006 |
| JP | 2006-040946 | 2/2006 |
| JP | 2006-202411 | 8/2006 |
| JP | 2008-108807 | 5/2008 |
| KR | 10-2006-0083368 | 7/2006 |
| WO | WO 00/49659 | 8/2000 |
| WO | WO 2006/077747 A1 | 7/2006 |

OTHER PUBLICATIONS

Fujimoto, M., et al., "High-Speed Resistive Switching of $TiO_2$/TiN Nano-Crystalline Thin Film", Japanese Journal of Applied Physics, 2006, pp. L310-L312, vol. 45 No. 11, The Japan Society of Applied Physics.

Z. Wei et al., "Highly Reliable $TaO_x$ ReRAM and Direct Evidence of Redox Reaction Mechanism," International Electron Devices Meeting, Dec. 15-17, 2008, San Francisco, pp. 1-4, XP031434432.

Extended European Search Report issued in European Patent Application No. EP 07 83 0485.4 dated Oct. 12, 2009.

Japanese Office Action issued in Japanese Patent Application No. 2008-236577 mailed Oct. 30, 2012.

Japanese Office Action issued in application No. 2008-236577 issued on Jun. 15, 2012.

Japanese Office Action issued in corresponding Japanese Application No. 2012-288753, dated Mar. 4, 2014.

\* cited by examiner (a)

(b)

(a)

(b)

PRIOR ART

NONVOLATILE MEMORY ELEMENT, NONVOLATILE MEMORY APPARATUS, NONVOLATILE SEMICONDUCTOR APPARATUS, AND METHOD OF MANUFACTURING NONVOLATILE MEMORY ELEMENT

RELATED APPLICATIONS

This application is the U.S. National Phase under 35 U.S.C. §371 of International Application No. PCT/JP2007/070751, filed on Oct. 24, 2007, which in turn claims the benefit of Japanese Application No. 2006-311910, filed on Nov. 17, 2006, the disclosures of which Applications are incorporated by reference herein.

TECHNICAL FIELD

The present invention relates to a nonvolatile memory element, a nonvolatile memory apparatus, a nonvolatile semiconductor apparatus, and a method of manufacturing a nonvolatile memory element. More particularly, the present invention relates to a resistance variable nonvolatile memory element, a resistance variable nonvolatile memory apparatus, and a resistance variable nonvolatile semiconductor apparatus, whose resistance values vary according to electric signals applied.

BACKGROUND ART

With recent advancement of digital technologies, higher functionality of electronic hardware such as portable information devices and home information appliances have been provided. For this reason, demands for an increase in a capacity of a nonvolatile memory element, a reduction in writing electric power in the memory element, a reduction in write/readout time in the memory element, and longer life of the memory element have been increasing.

In response to such demands, it is said that there is a limitation on miniaturization of an existing flash memory using a floating gate. On the other hand, a nonvolatile memory element (resistance variable memory) using a resistance variable layer as a material of a memory portion is formed by a memory element having a simple structure including a resistance variable element. Therefore, further minitualization, a higher-speed, and further electric power saving of the nonvolatile memory element are expected.

When using the resistance variable layer as the material of the memory portion, its resistance value varies from a high-resistance value to a low-resistance value or from the low-resistance value to the high-resistance value, for example, by inputting electric pulses. In this case, it is necessary to clearly distinguish two values, i.e., the high-resistance value and the low-resistance value, to vary the resistance value stably between the low-resistance value and the high-resistance value at a high-speed, and to hold these two values in a nonvolatile manner. For the purpose of stabilization of such a memory property and minitualization of memory elements, a variety of proposals have been proposed in the past.

As one of such proposals, patent document 1 discloses a memory element in which memory cells are formed by resistance variable elements each of which includes two electrodes and a storing layer sandwiched between these electrodes and is configured to reversibly vary a resistance value of the storing layer. FIG. 33 is a cross-sectional view showing a configuration of such a conventional memory element.

As shown in FIG. 33, the memory element has a configuration in which a plurality of resistance variable elements 10 forming memory cells are arranged in array. The resistance variable element 10 has a configuration in which a high-resistance film 2 and an ion source layer 3 are sandwiched between a lower electrode 1 and an upper electrode 4. The high-resistance film 2 and the ion source layer 3 form a storing layer. The storing layer enables data to be stored in the resistance variable element 10 in each memory cell.

The resistance variable elements 10 are disposed above MOS transistors 18 formed on a semiconductor substrate 11. The MOS transistor 18 includes source/drain regions 13 formed in a region separated by an isolation layer 12 inside the semiconductor substrate 11 and a gate electrode 14. The gate electrode 14 also serves as a word line which is one address wire of the memory element.

One of the source/drain regions 13 of the MOS transistor 18 is electrically connected to the lower electrode 1 of the resistance variable element 10 via a plug layer 15, a metal wire layer 16, and a plug layer 17. The other of the source/drain regions 13 of the MOS transistor 18 is connected to the metal wire layer 16 via the plug layer 15. The metal wire layer 16 is connected to a bit line which is the other address wire of the memory element.

By applying electric potentials of different polarities between the lower electrode 1 and the upper electrode 4 of the resistance variable element 10 configured as described above, ion source of the ion source layer 3 forming the storing layer is caused to migrate to the high-resistance layer 2. Or, the ion source is caused to migrate from the high-resistance layer 2 to the upper electrode 4. Thereby, the resistance value of the resistance variable element 10 transitions from a value of a high-resistance state to a value of a low-resistance state, or from a value of the low-resistance state to a value of the high-resistance state, so that data is stored.

A memory element (phase-change type memory) is also known, in which a resistance variable material sandwiched between an upper electrode and a lower electrode forms a first electric pulse varying resistance layer having a polycrystalline structure and a second electric pulse varying resistance layer having a nano crystal or an amorphous structure. The resistance layer formed of the resistance variable material is controlled by varying its resistance value according to a voltage and a pulse width of electric pulses applied, thereby operating as a resistance variable element (see, for example, patent document 2).

Examples using transition metal oxide consisting of two elements, which are different from the resistance variable materials disclosed in Patent documents 1 and 2, are reported. For example, Patent document 3 discloses as the resistance variable material, NiO, $V_2O_5$, ZnO, $Nb_2O_5$, $TiO_2$, $WO_3$, and CoO. These materials consist of two elements and therefore, composition control therefor and film forming using them are relatively easy. In addition, these materials may have relatively high affinity with a semiconductor manufacturing process.

Patent document 4 discloses a variety of resistance variable materials obtained by the fact that a p-type oxide semiconductor material comprising metal elements has rapid metal-insulator transfer. In particular, specific examples thereof are Ga, As and $VO_2$. Patent document 5 discloses, as examples of a resistance variable material, titanium oxide and $Ta_2O_5$ which is tantalum oxide as insulators whose resistance states change, respectively.

Patent document 1: Japanese Laid-Open Patent Application Publication No. 2006-40946
Patent document 2: Japanese Laid-Open Patent Application Publication No. 2004-349689
Patent document 3: Japanese Laid-Open Patent Application Publication No. 2004-363604
Patent document 4: Japanese Laid-Open Patent Application Publication No. 2006-32898
Patent document 5: Japanese Laid-Open Patent Application Publication No. Hei. 7-263647
Non-patent document 1: I. G. Beak Et Al., Tech. Digest IEDM 204, 587 page
Non-patent document 2: Japanese Journal of Applied Physics Vol 145, NO 11, 2006, pp. L3 10-L312 FIG. 2

DISCLOSURE OF THE INVENTION

Problems to be Solved by the Invention

The transition metal oxides used as the above described conventional resistance variable materials have the following problems.

When using the transition metal oxide such as NiO, a long pulse of μs order is required to change the resistance variable material from the low-resistance state to the high-resistance state. Therefore, a problem that a higher-speed is difficult to achieve arises.

When using $TiO_2$ as the transition metal oxide, TiN is required to be oxidized in oxygen atmosphere at 400° C. to form a $TiO_2$/TiN film structure. Therefore, a problem that a relatively high process temperature must be used arises.

When using $Ta_2O_5$ as the transition metal material, it serves as an anti fuse which is usable only in one operation from the high-resistance state to the low-resistance state. Therefore, a problem that rewriting cannot be performed arises.

The present invention is made in view of the circumstances, and an object of the present invention is to provide a nonvolatile memory element which is capable of high-speed operation, has a reversibly stable rewrite characteristic and a desired retention characteristic of a resistance value, and has high affinity with a semiconductor manufacturing process, and a manufacturing method thereof, and a nonvolatile memory apparatus and a nonvolatile semiconductor apparatus including the nonvolatile memory element.

Means for Solving the Problem

To achieve the above described objective, a nonvolatile memory element of the present invention comprises a first electrode; a second electrode; and a resistance variable layer disposed between the first electrode and the second electrode, a resistance value of the resistance variable layer varying reversibly according to an electric signal applied between the first electrode and the second electrode; wherein the resistance variable layer comprises at least a tantalum oxide, and is configured to satisfy $0<x<2.5$ when the tantalum oxide is represented by TaOx.

A tantalum oxide layer forming the resistance variable layer has a composition in which oxygen is less than oxygen of $Ta_2O_5$, and is not an insulator. As defined herein, the term "insulator" conform to a general insulator. To be specific, the insulator is defined as substance having a resistivity of $10^8$ Ωm or larger (based on "Semiconductor Engineering for Integrated Circuit" Industrial Research Community (1992) Usami Akira, Kanefusa Shinji, Maekawa Takao, Tomokage Hajime, Inoue Morio.)

It is preferable that the resistance variable layer comprises at least a tantalum oxide, and is configured to satisfy $0<x\le1.9$ when the tantalum oxide is represented by TaOx.

It is more preferable that the resistance variable layer comprises at least a tantalum oxide, and is configured to satisfy $0.5\le x\le1.9$ when the tantalum oxide is represented by TaOx.

It is more preferable that the resistance variable layer comprises at least a tantalum oxide, and is configured to satisfy $0.8\le x\le1.9$ when the tantalum oxide is represented by TaOx.

The resistance value of the resistance variable layer may vary reversibly according to a bipolar electric signal applied between the first and second electrodes.

It is preferable that at least one of the first electrode and the second electrode comprises at least one material selected from a group consisting of Pt, Ir, Cu, Au, Ag, TiN, and TiAlN.

A nonvolatile memory apparatus of the present invention comprises a semiconductor substrate; and a memory array including a plurality of first electrode wires formed on the semiconductor substrate to extend in parallel with each other; a plurality of second electrode wires formed above the plurality of first electrode wires so as to extend in parallel with each other within a plane parallel to a main surface of the semiconductor substrate and so as to three-dimensionally cross the plurality of first electrode wires; and nonvolatile memory elements provided to respectively correspond to three-dimensional cross points of the plurality of first electrode wires and the plurality of second electrode wires; wherein each of the nonvolatile memory elements includes a resistance variable layer disposed between an associated one of the first electrode wires and an associated one of the second electrode wires, a resistance value of the resistance variable layer varying reversibly according to an electric signal applied between the first electrode wire and the second electrode wire; wherein the resistance variable layer comprises at least a tantalum oxide, and is configured to satisfy $0<x<2.5$ when the tantalum oxide is represented by TaOx.

Each of the nonvolatile memory elements may include a first electrode connected to the first electrode wire, a second electrode connected to the second electrode wire, and the resistance variable layer disposed between the first electrode and the second electrode; and the resistance value of the resistance variable layer may vary reversibly according to an electric signal applied to the first electrode wire and the second electrode wire and thereby applied between the first electrode and the second electrode.

Each of the nonvolatile memory elements may include a current restricting element provided between the first electrode and the second electrode. The current restricting element may be electrically connected to the resistance variable layer.

A nonvolatile memory apparatus may comprise a multilayer memory array including a plurality of memory arrays stacked.

A nonvolatile memory apparatus of the present invention comprises a semiconductor substrate; and a plurality of word lines and a plurality of bit lines which are formed on the semiconductor substrate and are arranged to cross each other; a plurality of transistors provided to respectively correspond to intersections of the plurality of word lines and the plurality of bit lines; and a plurality of nonvolatile memory elements provided to respectively correspond to the plurality of transistors; wherein each of the nonvolatile memory elements includes a first electrode, a second electrode, and a resistance variable layer which is disposed between the first electrode and the second electrode, a resistance value of the resistance variable layer varying reversibly according to an electric signal applied between an associated one of the bit lines and an associated one of the word lines and thereby applied between the first electrode and the second electrode through an associated one of the transistors; wherein the resistance variable layer comprises at least a tantalum oxide, and is configured to satisfy 0<x<2.5 when the tantalum oxide is represented by TaOx.

A nonvolatile memory apparatus of the present invention comprises a semiconductor substrate; a logic circuit formed on the semiconductor substrate, for executing predetermined calculation; and a nonvolatile memory element formed on the semiconductor substrate and having a programming function, wherein the nonvolatile memory element includes a first electrode, a second electrode, and a resistance variable layer disposed between the first electrode and the second electrode, a resistance value of the resistance variable layer varying reversibly according to a voltage applied between the electrodes; and wherein the resistance variable layer comprises at least a tantalum oxide, and is configured to satisfy 0<x<2.5 when the tantalum oxide is represented by TaOx.

A nonvolatile semiconductor apparatus of the present invention comprises the nonvolatile semiconductor apparatus according to claim 12; and the nonvolatile memory apparatus according to any one of claims 7, 8, and 11.

A method of manufacturing a nonvolatile memory element of the present invention, including a first electrode; a second electrode; and a resistance variable layer disposed between the first electrode and the second electrode, a resistance value of the resistance variable layer varying according to an electric signal applied between the first electrode and the second electrode; wherein the resistance variable layer comprises at least a tantalum oxide, and is configured to satisfy 0<x<2.5 when the tantalum oxide is represented by TaOx, the method comprising: forming the tantalum oxide by a sputtering process.

Foregoing object, other object, features, and advantages of the present invention will be apparent from the following detailed description of the preferred embodiments with reference to accompanying drawings.

Effects of the Invention

In accordance with the present invention, a nonvolatile memory element which is capable of high-speed operation, has a reversibly stable rewrite characteristic and a desired retention characteristic of a resistance value, and has high affinity with a semiconductor manufacturing process, and a manufacturing method thereof, and a nonvolatile semiconductor apparatus or the like including the nonvolatile memory element.

BRIEF DESCRIPTION OF THE DRAWINGS

FIG. 5 is a view showing a relationship between the number of pulse applications and a resistance value of a resistance variable layer included in the nonvolatile memory element according to Embodiment 1 of the present invention, wherein FIG. 5(a) is a view showing the relationship between the resistance value and the number of pulse applications in a case where a film thickness of the resistance variable layer is 25 nm, and FIG. 5(b) is a view showing the relationship between the resistance value of the resistance variable layer and the number of pulse applications in a case where the film thickness of the resistance variable layer is 220 nm and electric pulses are continuously applied between the electrodes;

FIG. 6 is a view showing an electric characteristic of the nonvolatile memory element, wherein FIG. 6(a) is a view showing a current-voltage characteristic of the nonvolatile memory element according to Embodiment 1 of the present invention, and FIGS. 6(b) and 6(c) are views showing current-voltage characteristics of the nonvolatile memory elements according to Comparative example 1 and Comparative example 2, respectively;

FIG. 7 is a view showing results of Auger analysis, wherein FIG. 7(a) is a view showing a result of the Auger analysis in a depth direction of a sample which is the resistance variable layer included in the nonvolatile memory element according to Embodiment 1 of the present invention and shows the resistance varying phenomenon as described above and FIG. 7(b) is a view showing a result of the Auger analysis in a depth direction of sample metal Ta which does not show the resistance varying phenomenon as described above;

Figure 1:
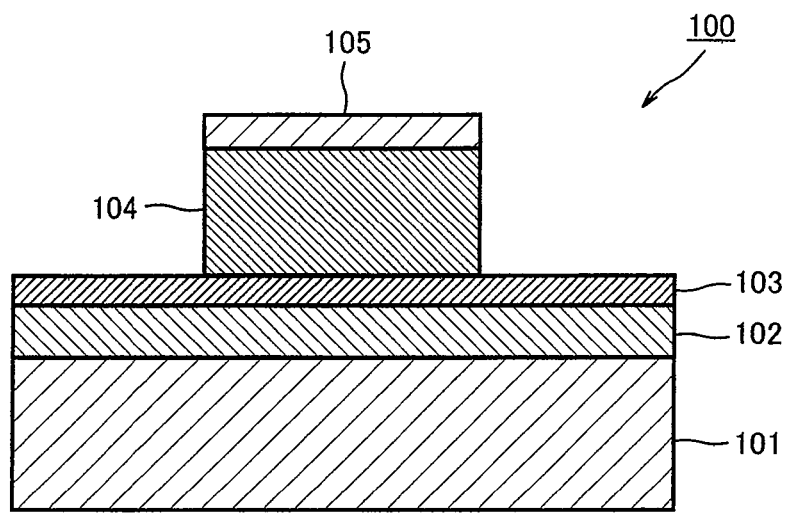
FIG. 1 is a cross-sectional view showing an example of a configuration of a nonvolatile memory element according to Embodiment 1 of the present invention.

EXPLANATION OF REFERENCE NUMERALS 100 nonvolatile memory element
101 substrate
102 oxide layer
103 first electrode layer
104 resistance variable layer
105 second electrode layer
200 nonvolatile memory apparatus
201 memory main body
202 memory array
203 row selection circuit/driver
204 column selection circuit/driver
205 write circuit
206 sense amplifier
207 data input/output circuit
208 address input circuit
209 control circuit
210 nonvolatile memory element
211 upper wire
212 lower wire
213 upper electrode
214 resistance variable layer
215 inner electrode
216 current restricting element
217 lower electrode
218 ohmic resistance layer
219 second resistance variable layer
300 nonvolatile memory apparatus
301 memory main body
302 memory array
303 row selection circuit/driver
304 column selection circuit
305 write circuit
306 sense amplifier
307 data input/output circuit
308 cell plate electric power supply
309 address input circuit
310 control circuit
313 nonvolatile memory element
314 upper electrode
315 resistance variable layer
316 lower electrode
400 nonvolatile semiconductor apparatus
401 semiconductor substrate
402 CPU
403 input/output circuit
404 logic circuit'
405 analog circuit
406 BIST circuit
407 SRAM
408 relief address storage register
409 nonvolatile memory element
410 write circuit
411 readout circuit
412 latch circuit
BL0, BL1, . . . bit line
M11, M12, . . . memory cell
T11, T12, . . . transistor
WL0, WL1, . . . word line

BEST MODE FOR CARRYING OUT THE INVENTION

Hereinafter, embodiments of the present invention will be described with reference to the drawings. Throughout the drawings, the same reference numerals are assigned to the same or corresponding parts, which will not be described in some cases.

Embodiment 1

Configuration of Nonvolatile Memory Element

FIG. 1 is a cross-sectional view showing an example of a configuration of the nonvolatile memory element according to Embodiment 1 of the present invention.

As shown in FIG. 1, the nonvolatile memory element 100 includes a substrate 101, an oxide layer 102 formed on the substrate 101, a first electrode layer 103 formed on the oxide layer 102, a second electrode 105, and a resistance variable layer 104 sandwiched between the first electrode layer 103 and the second electrode layer 105.

When the nonvolatile memory element 100 is driven, a voltage (electric signal) meeting a predetermined condition is applied between the first electrode layer 103 and the second electrode 105 from an external electric power supply. The resistance value of the resistance variable layer 104 of the nonvolatile memory element 100 increases or decreases according to the direction (the polarity of voltage) in which the voltage is applied. For example, when a pulse voltage larger than a predetermined threshold voltage is applied, the resistance value of the resistance variable layer 104 increases or decreases, whereas when a pulse voltage smaller than the predetermined threshold voltage is applied, the resistance value of the resistance variable layer 104 does not vary.

As materials for the first electrode layer 103 and the second electrode layer 105, for example, Pt (platinum), Ir (iridium), Cu (copper), Au (gold), Ag (silver), TiN (titanium nitride), or TiAlN (titanium aluminum nitride), may be used.

The resistance variable layer 104 comprises tantalum oxide. As defined herein, the tantalum oxide satisfies $0 < x < 2.5$ when the tantalum oxide is represented by $TaO_x$. The reason why x falls within this range will be described later.

As the substrate 101, a silicon single crystal substrate or a semiconductor substrate may be used, but the substrate 101 is not limited to these substrates. Since the resistance variable layer 104 can be formed at a relatively low substrate temperature, it can be formed on a material such as resin.

[Manufacturing Method of Nonvolatile Memory Element]

Subsequently, a manufacturing method of the nonvolatile memory element 101 of this embodiment will be described in detail.

Initially, on the substrate 101 which is a single crystal silicone, an oxide layer (insulating layer made of $SiO_2$) having a thickness of 20 nm is formed by a thermal oxidation process. A Pt thin film having a thickness of 100 nm is formed as the first electrode layer 103 on the oxide layer 102 by a RF magnetron sputtering process. In this case, the film is formed under the condition in which a degree of vacuum is 1.0 Pa, an RF power is 250 W, an Ar flow rate is 10 sccm, and a film forming time is 20 minutes.

Next, a tantalum oxide film which is the resistance variable layer 104 is formed on the first electrode layer 103 by a reactive RF sputtering process using a Ta target. Film forming conditions in this case are shown on table 1.

TABLE 1

| Target | Ta |
|---|---|
| Degree of vacuum (Pa) | 0.2-5 (Pa) |
| Substrate heating temperature (° C.) | 20-400 (° C.) |
| Sputtering gas | Ar + $O_2$ |
| $O_2$ flow rate ratio (%) | 0.1-10 (%) |
| RF-Power (W) | 150-300 (W) |
| Film thickness (nm) | 1-300 (nm) |

Finally, a Pt thin film having a thickness of 150 nm is formed as the second electrode layer 105 on the resistance variable layer 104 by the RF sputtering process. The film forming condition in this case is identical to that for forming the first electrode layer 103.

Figure 2:
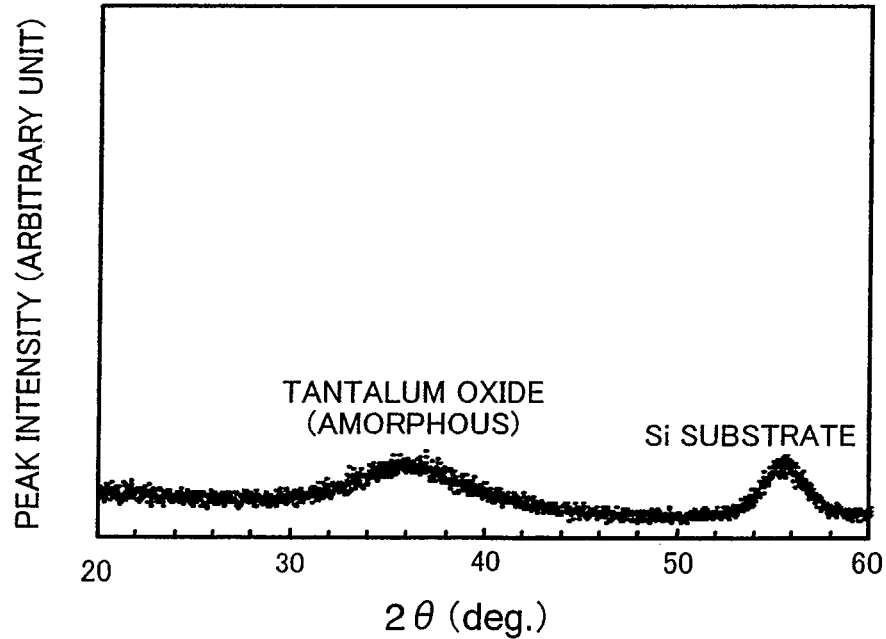
FIG. 2 is a XRD (X-ray diffraction) chart of a resistance variable layer which is made of a tantalum oxide and has a film thickness of 40 nm, which is obtained when a substrate temperature is 30° C., and $O_2$ flow rate ratio is 0.5%.

FIG. 2 is a XRD (X-ray diffraction) chart of a resistance variable layer made of a tantalum oxide having a film thickness of 40 nm, which is obtained when a substrate temperature is 30° C., and $O_2$ flow rate ratio ($O_2$ flow rate ratio in a sputtering gas) is 0.5%. As can be seen from 2, a peak of metal Ta cannot be confirmed, and therefore, it may be presumed that the tantalum oxide is obtained. In addition, it may be considered that the tantalum oxide has an amorphous state because a broad peak is confirmed in a range where 2θ is 30 to 40 degrees. Note that the peak appearing when 2θ is 56 degrees is attributed to the silicon substrate.

To form the resistance variable layer 104, a sputtering process which does not use a reactive gas such as $O_2$ may be employed by using the tantalum oxide as the target.

[Example of Operation of Nonvolatile Memory Element]

Subsequently, an example of the operation of the nonvolatile memory element 101, i.e., an example of the operation in writing and reading out of data will be described with reference to the drawings.

Figure 3:
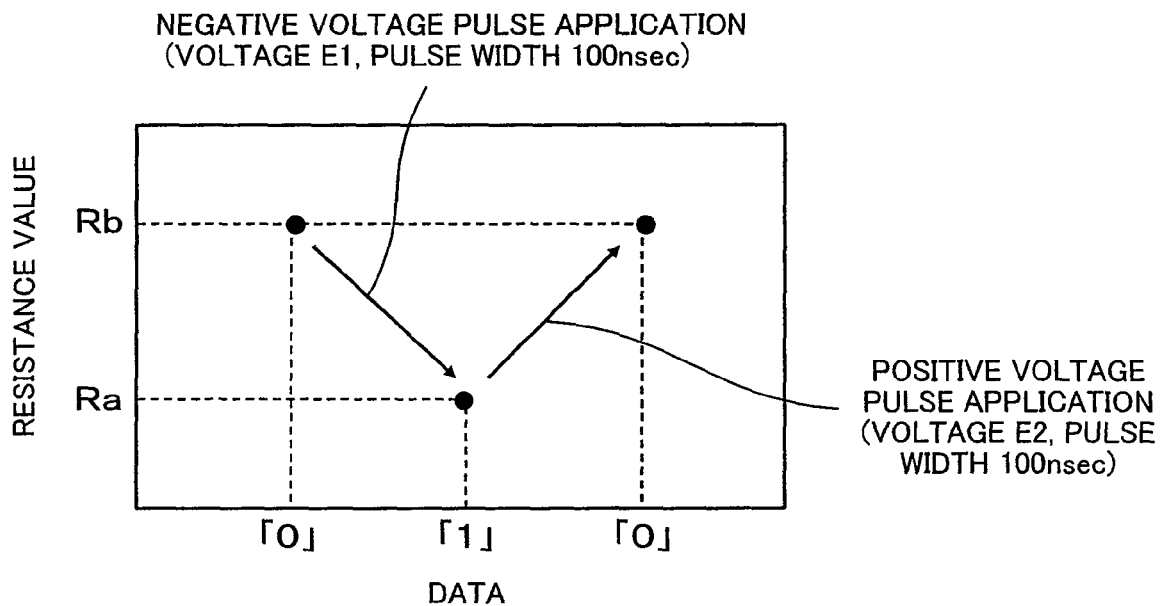
FIG. 3 is a view showing an example of the operation of the nonvolatile memory element according to Embodiment 1 of the present invention, which occurs when writing data.

FIG. 3 is a view showing an example of the operation of the nonvolatile memory element according to Embodiment 1 of the present invention, which occurs when writing data.

When two kinds of electric pulses having different polarities and a pulse width of 100 nsec are applied alternately between the first electrode layer 103 and the second electrode layer 105 (hereinafter sometimes expressed as between the electrodes), the resistance value of the resistance variable layer 104 varies as shown in FIG. 3. To be specific, when a negative voltage pulse (voltage E1, pulse width 100 nsec) is applied between the electrodes, the resistance value of the resistance variable layer 104 decreases from a high-resistance value Rb (850Ω) to a low-resistance value Ra (150Ω). On the other hand, when a positive voltage pulse (voltage E2, pulse width 100 nsec) is applied between the electrodes, the resistance value of the resistance variable layer 104 increases from the low-resistance value Ra to the high-resistance value Rb. In this case, the voltage E1 is −3.5V and the voltage E2 is +2.5V.

In the example shown in FIG. 3, the high-resistance value Rb is allocated to data "0" and the low-resistance value Ra is allocated to data "1." Therefore, the data "0" is written by applying the positive voltage pulse between the electrodes so that the resistance value of the resistance variable layer 104 becomes the high-resistance value Rb, while the data "1" is written by applying the negative voltage pulse between the electrodes so that the resistance value becomes the low-resistance value Ra.

Figure 4:
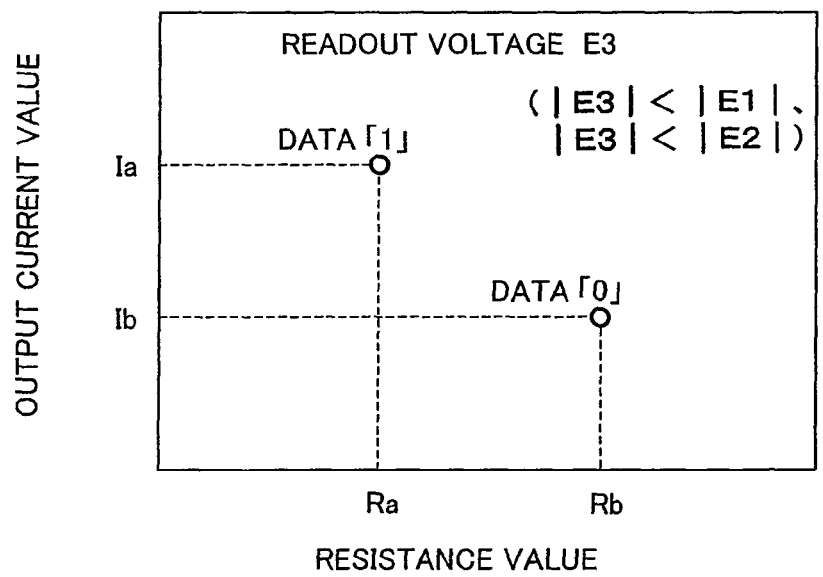
FIG. 4 is a view showing an example of the operation of the nonvolatile memory element according to Embodiment 1 of the present invention, which occurs when reading out data.

FIG. 4 is a view showing an example of the operation of the nonvolatile memory element according to Embodiment 1 of the present invention, occurring when reading out data.

When reading out data, a readout voltage E3 (|E3|<|E1|, |E3|<|E2|) which has an amplitude smaller than that of the electric pulse applied to vary the resistance value of the resistance variable layer 104 is applied between the electrodes. As a result, a current corresponding to the resistance value of the resistance variable layer 104 is output, and its output current value is detected, thereby enabling reading out of the written data.

In the example illustrated in FIG. 4, since an output current value Ia corresponds to the resistance value Ra and an output current value Ib corresponds to the resistance value Rb, the data "1" is read out when the output current value Ia is detected, while the data "0" is read out when the output current value Ib is detected.

Since the resistance variable layer 104 serves as a memory portion in a region sandwiched between the first electrode layer 103 and the second electrode layer 104 in the manner described above, the nonvolatile memory element 101 operates as a memory.

[Resistance Varying Characteristic of Nonvolatile Memory Element]

Subsequently, a resistance varying characteristic in a case where electric pulses are applied to the nonvolatile memory element 100 according to this embodiment will be described.

Figure 5:
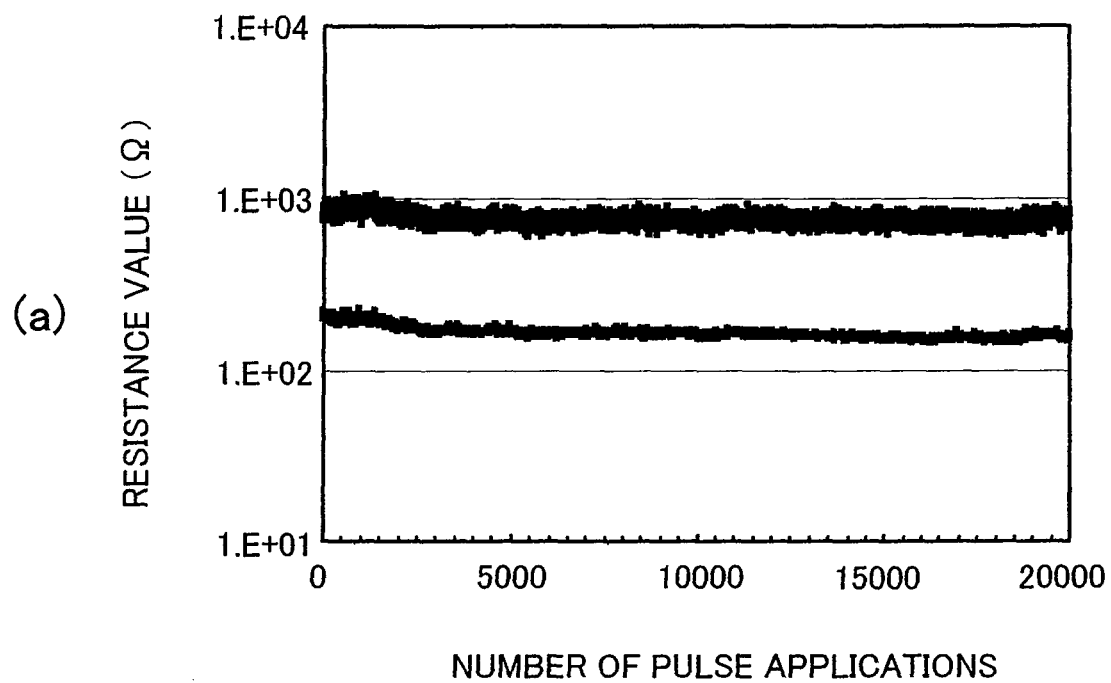
Figure 5:
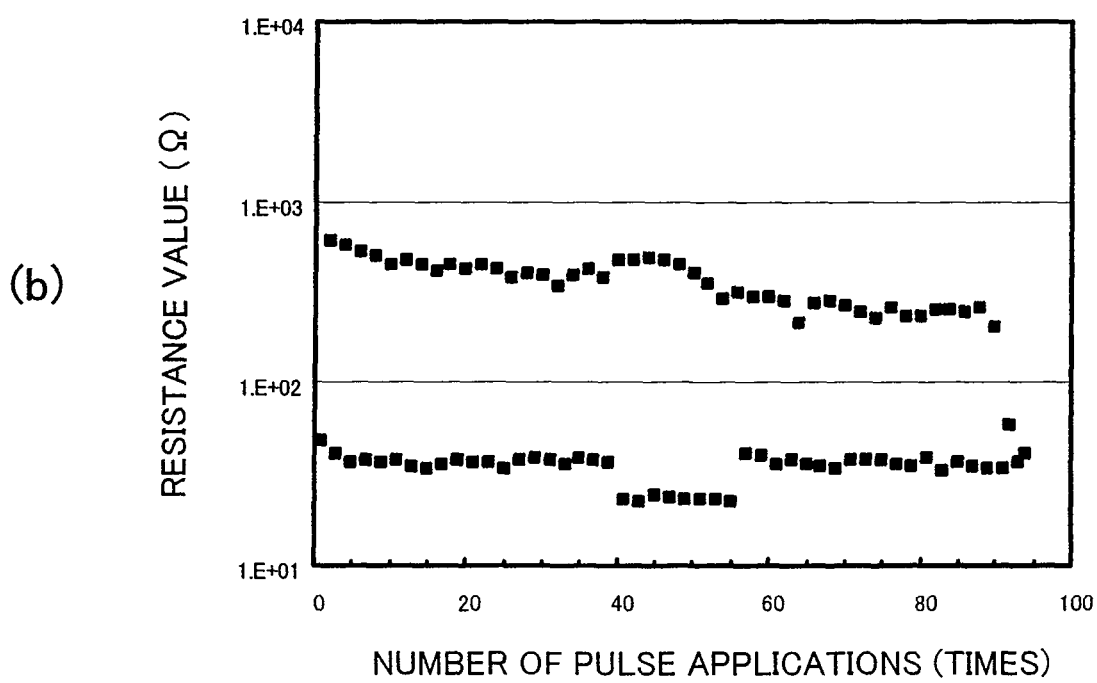

FIG. 5(a) is a view showing a relationship between the number of pulse applications and the resistance value of the resistance variable layer 104 included in the nonvolatile memory element according to Embodiment 1 of the present invention. FIG. 5 shows a result obtained when two kinds of electric pulses having different polarities and having a pulse width of 100 nsec are applied alternately between the first electrode layer 103 and the second electrode layer 105.

By applying two kinds of electric pulses alternately between the electrodes, the resistance value of the resistance variable layer 104 varied reversibly as shown in FIG. 5(a). To be specific, when a negative voltage pulse (voltage−3.5V, pulse width 100 nsec) is applied between the electrodes, the resistance value of the resistance variable layer 104 decreases to 150Ω (low-resistance value), while when a positive voltage pulse (voltage+2.5V, pulse width 100 nsec) is applied between the electrodes, the resistance value of the resistance variable layer 104 increases to 850Ω (high-resistance value). Such a resistance variation continued stably even though the pulses were applied continuously 20000 times.

From the above result, it can be confirmed that a resistance variable nonvolatile memory element having a stably reversible rewrite characteristic at a low voltage is attainable by using the resistance variable layer 104.

FIG. 5(a) shows the result of the resistance variable layer 104 having a film thickness of 25 nm and a circular pattern of a diameter 2 μm. Hereinbelow, the resistance variable layer 104 will be described as having such a size, except for special cases.

FIG. 5(b) is a view showing the relationship between the resistance value of the resistance variable layer and the number of pulse applications in a case where the film thickness of the resistance variable layer is 220 nm and electric pulses are applied continuously between the electrodes. As can be seen from the result of FIG. 5(b), the nonvolatile memory element according to this embodiment operates with electric pulses of 100 nsec. As can be seen from these results, the nonvolatile memory element has a wide resistance varying region with respect to the film thickness. For this reason, when forming of the resistance variable layer in the nonvolatile memory element of this embodiment, a matching with a semiconductor process for forming another circuit regions can be easily made, by controlling the film thickness of the resistance variable layer.

[Current-Voltage Characteristic of Nonvolatile Memory Element]

Subsequently, a current-voltage characteristic of the nonvolatile memory element 100 according to this embodiment will be described by comparing the characteristic with that of Comparative example.

Figure 6:
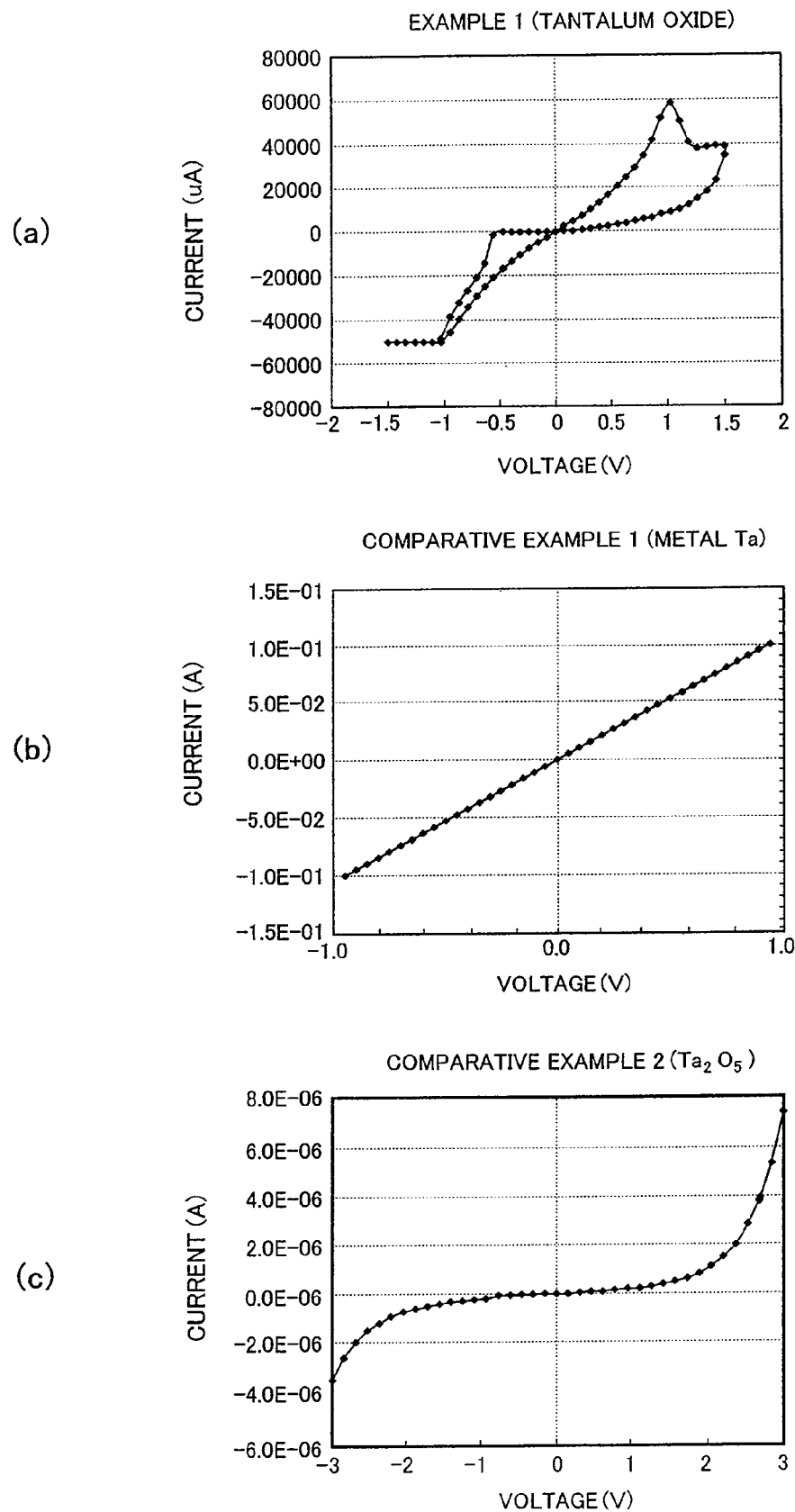

FIG. 6(a) is a view showing a current-voltage characteristic of the nonvolatile memory element according to Embodiment 1 of the present invention. FIGS. 6(b) and 6(c) are views showing current-voltage characteristics of nonvolatile memory elements according to Comparative example 1 and Comparative example 2, respectively.

As used herein, Comparative example 1 is an element having a structure in which metal Ta is sandwiched between the first electrode layer and the second electrode layer, and Comparative example 2 is an element having a structure in which $Ta_2O_5$ resulting from advanced oxidation of Ta is sandwiched between the first electrode layer and the second electrode layer.

As shown in FIG. 6(a), in the nonvolatile memory element 100 of this embodiment, the current-voltage characteristic shows a hysteresis characteristic. On the other hand, as shown in FIGS. 6(b) and 6(C), in each of the elements according to Comparative example 1 and Comparative example 2, the current-voltage characteristic does not show the hysteresis characteristic.

From the above, it can be confirmed that the nonvolatile memory element 100 of this embodiment serves as a resistance variable nonvolatile memory element by using the resistance variable layer 104.

A resistance varying phenomenon was not confirmed although the electric pulses were actually applied to Comparative example 1 and Comparative example 2. For this reason, Comparative example 1 and Comparative example 2 cannot be used as the resistance variable nonvolatile memory element having a reversible rewrite characteristic.

[Composition of Resistance Variable Layer]

Subsequently, a composition of the resistance variable layer 104 comprising the tantalum oxide will be described.

Figure 7:
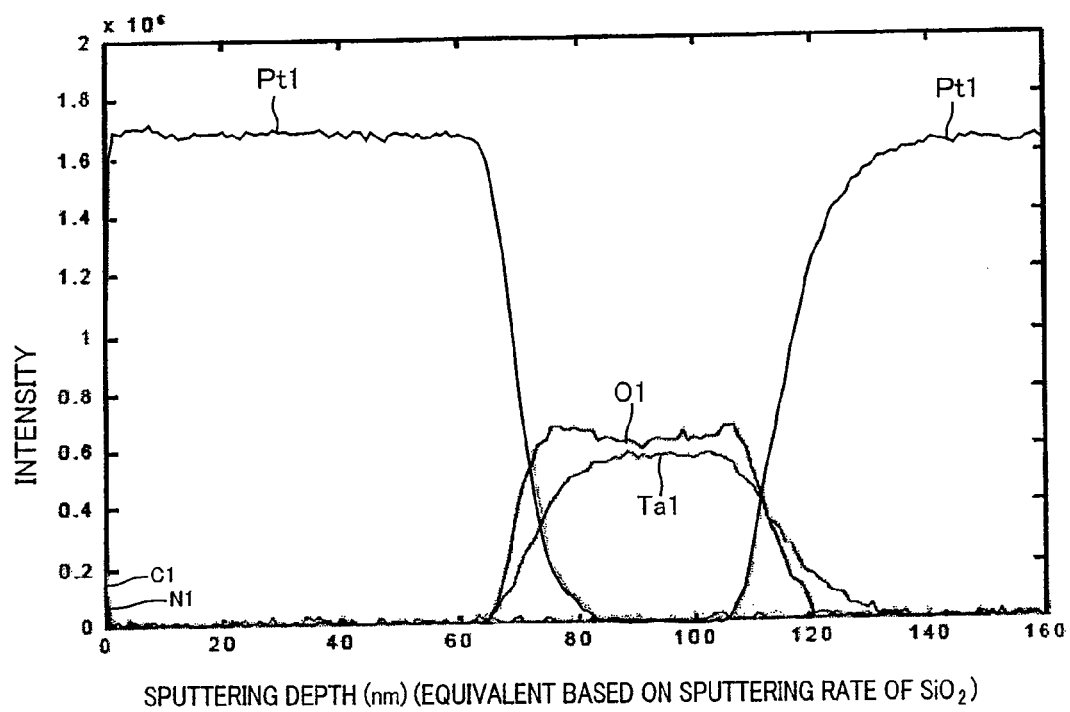
Figure 7:
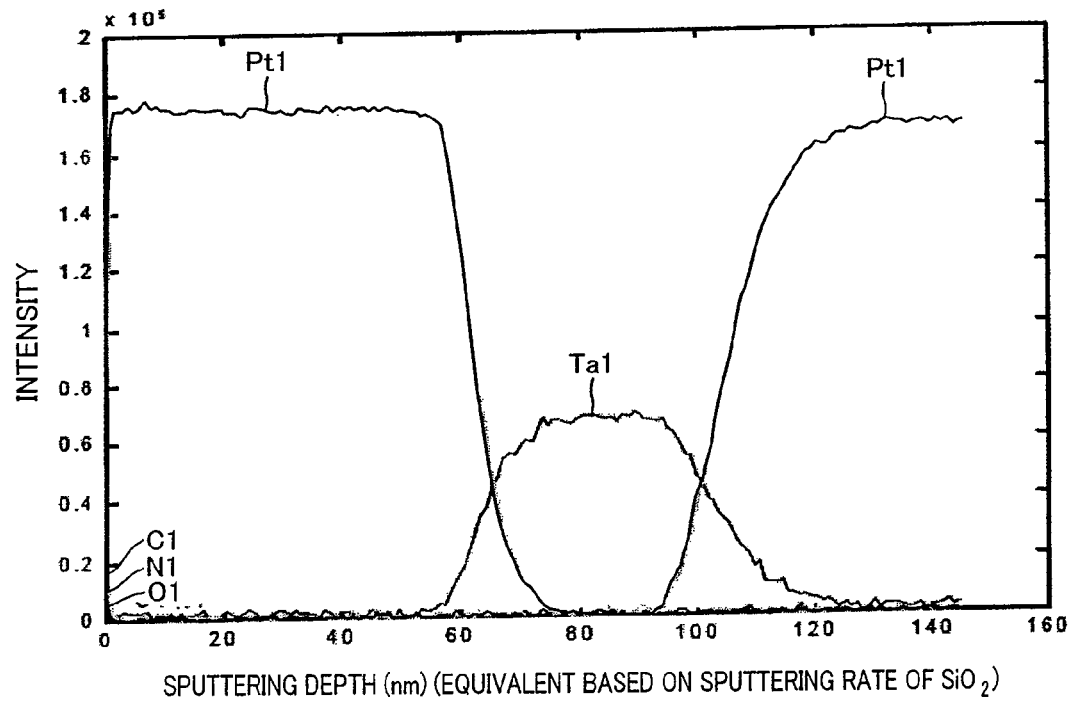

FIG. 7(a) is a view showing a result of the Auger analysis in a depth direction of a sample which is the resistance variable layer included in the nonvolatile memory element according to Embodiment 1 of the present invention and shows the resistance varying phenomenon as described above. FIG. 7(b) is a view showing a result of the Auger analysis in a depth direction of sample metal Ta which does not show the resistance varying phenomenon as described above.

The sample metal Ta is identical to that in Comparative example 1 described above and has a thickness of 20 nm. An upper Pt electrode having a thickness of 50 nm is formed on the sample metal Ta.

As should be clearly understood from comparison between FIGS. 7(a) and 7(b), only in the sample showing the resistance varying phenomenon, tantalum have been oxidized. A result of analysis of an atom ratio between Ta and O in the sample which is the resistance variable layer included in the nonvolatile memory element according to Embodiment 1 of the present invention was O/Ta=0.5/1.

Furthermore, more accurate composition analysis was conducted by a RBS (Rutherford Back Scattering) method. As a result, a composition of the sample of "O/Ta=0.5/1" atom ratio in the Auger analysis was O/Ta=1.4/1. Note that the composition analysis according to the RBS method relates to an average composition of the entire film. Some documents (for example, Journal of Vacuum Science A, Volume 21, No. 3, (2003) P 616-622, Pei-Chuen Jiang and J. S. Chen) report that the result of the Auger analysis is different from the result of the RBS analysis as described above. According to this document, it is required that a sensitivity coefficient be compensated for each material in the Auger analysis, and the RMS analysis generally provides higher reliability than the Auger analysis.

The result of the RBS analysis corresponds to a composition of a center region in a film thickness direction of the tantalum oxide in the result of the Auger analysis in FIG. 7(a). As can be seen from FIG. 7(a), an oxygen content rate increases in the vicinity of both interfaces (interfaces with respect to the Pt layer) of the tantalum oxide. Therefore, there is a possibility that the oxygen content rate in the interface regions is higher than the composition analyzed by the RBS method.

Figure 8:
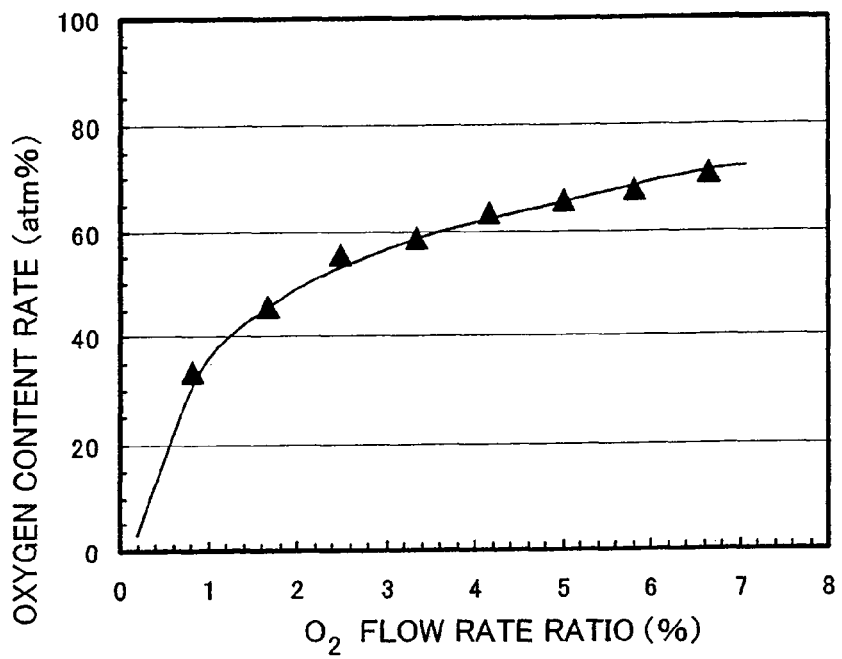
FIG. 8 is a view showing a relationship between an oxygen content rate and an $O_2$ flow rate ratio of a film forming gas of the resistance variable layer included in the nonvolatile memory element according to Embodiment 1 of the present invention.

FIG. 8 is a view showing a relationship between the O₂ flow rate ratio of the sputtering gas and the oxygen content rate of the tantalum oxide layer which is the resistance variable layer which is analyzed by the RBS method. It is confirmed that the oxygen content rate tends to be saturated when the O₂ flow rate ratio is 7% or higher. Nonetheless, it can be seen that the composition of the tantalum oxide layer can be controlled continuously based on the O₂ flow rate ratio. That is, when the tantalum oxide layer is formed by the reactive RF sputtering process, the oxygen content rate of the tantalum oxide layer can be controlled to have a desired constant value in the thickness direction of the tantalum oxide layer by controlling the O₂ flow rate ratio of the sputtering gas.

In accordance with the resistance varying characteristic of the nonvolatile memory element of this embodiment, the current-voltage characteristic of the nonvolatile memory element, and the composition of the resistance variable layer in the nonvolatile memory element, it may be considered to be essential that tantalum have been oxidized to a certain extent, to show a desired resistance varying phenomenon.

[Relationship between O₂ Flow Rate Ratio and Resistance Rate]

Subsequently, a relationship between the O₂ flow rate ratio and the resistivity in the manufacturing process of the resistance variable layer 104 of the nonvolatile memory element 101 will be described.

Figure 9:
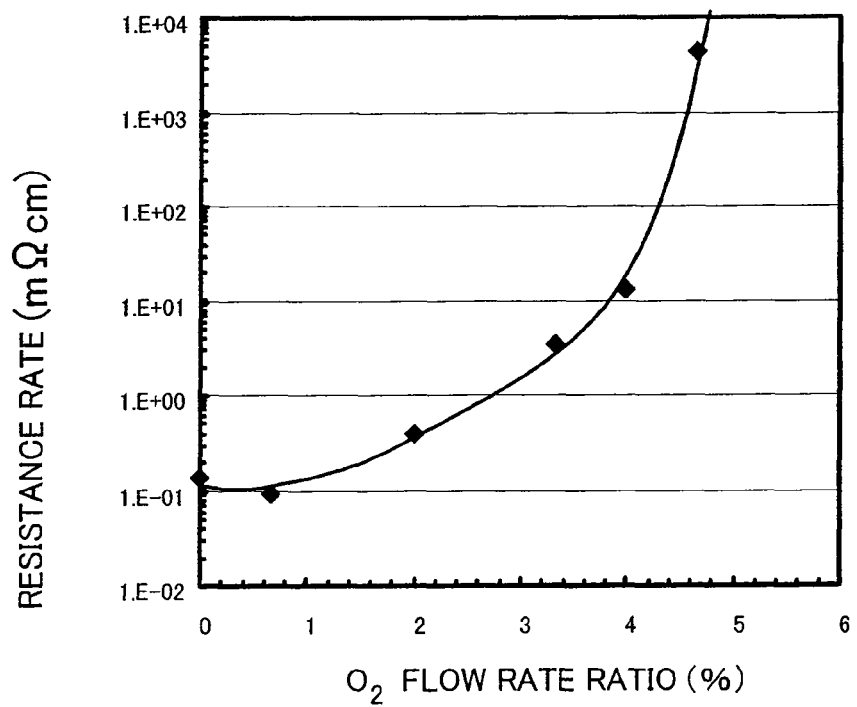
FIG. 9 is a view showing a relationship between the $O_2$ flow rate ratio and a resistivity of the resistance variable layer included in the nonvolatile memory element according to Embodiment 1 of the present invention.
Figure 10:
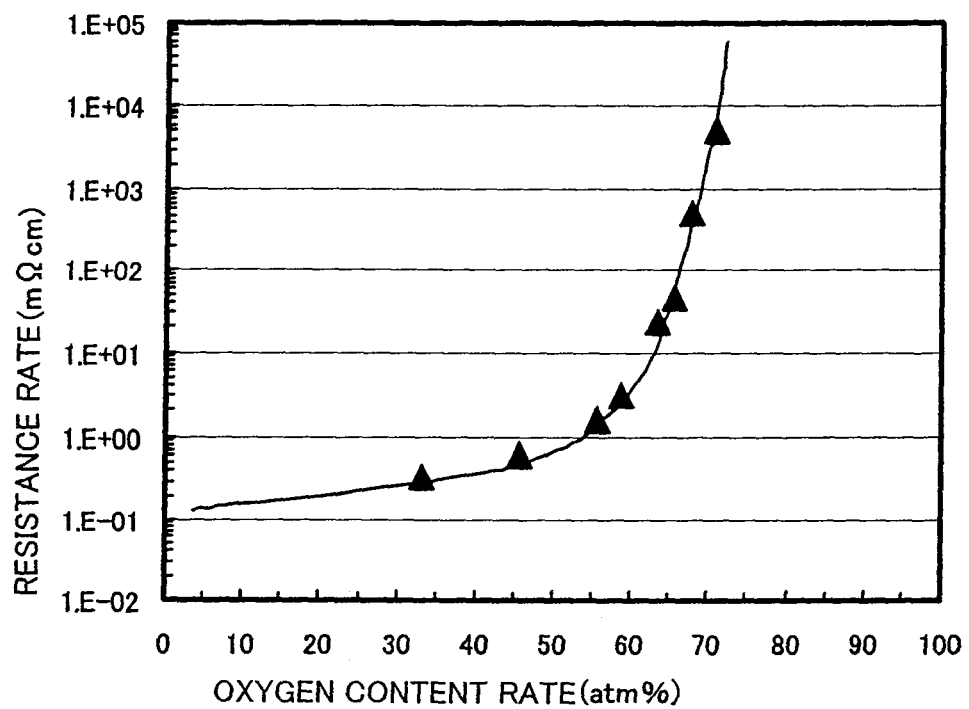
FIG. 10 is a view showing a relationship between the oxygen content rate and the resistivity of the resistance variable layer included in the nonvolatile memory element according to Embodiment 1 of the present invention.

FIG. 9 is a view showing a relationship between the O₂ flow rate ratio and resistivity of the resistance variable layer included in the nonvolatile memory element according to Embodiment 1 of the present invention. FIG. 10 is a view showing a relationship between the oxygen content rate and the resistivity of the resistance variable layer included in the nonvolatile memory element according to Embodiment 1 of the present invention. The resistivity described here is calculated based on a sheet resistance value obtained by measuring the sample in which only the resistance variable layer is directly formed on the substrate (silicon wafer provided with a nitride film) by a four-terminal method.

As can be seen from FIG. 9, the resistivity of the resistance variable layer 104 changes continuously according to the value of the O₂ flow rate ratio. To be more detailed, as described above, the oxygen content rate of the tantalum oxide layer (resistance variable layer 104) changes continuously according to the value of the O₂ flow rate ratio. As shown in FIG. 10, the resistivity of the resistance variable layer 104 changes continuously according to the oxygen content rate. Therefore, the resistivity of the resistance variable layer 104 can be controlled continuously based on the oxygen content rate of the resistance variable layer 104. From this, it may be considered that the oxygen content rate of the resistance variable layer 104 must fall within an appropriate range to obtain a desired resistance varying phenomenon in the resistance variable layer 104.

The inventors measured resistivities of samples having oxygen content rates shown in FIG. 10 and found a regression curve of measurement data. FIG. 10 shows the measurement data (indicated by black triangles) and the regression curve thereof. Also, the inventors confirmed that the samples having the oxygen content rates exhibit the resistance varying characteristic by applying the electric pulses to the samples. According to the regression curve, it may be presumably recognized that the resistance variable layer is an electric conductor (a substance having a resistivity defined as the electric conductor) and exhibits the resistance varying phenomenon confirmed in each sample when x satisfies $0 < x < 2.5$ in the case where the resistance variable layer is represented by TaOx.

Figure 11:
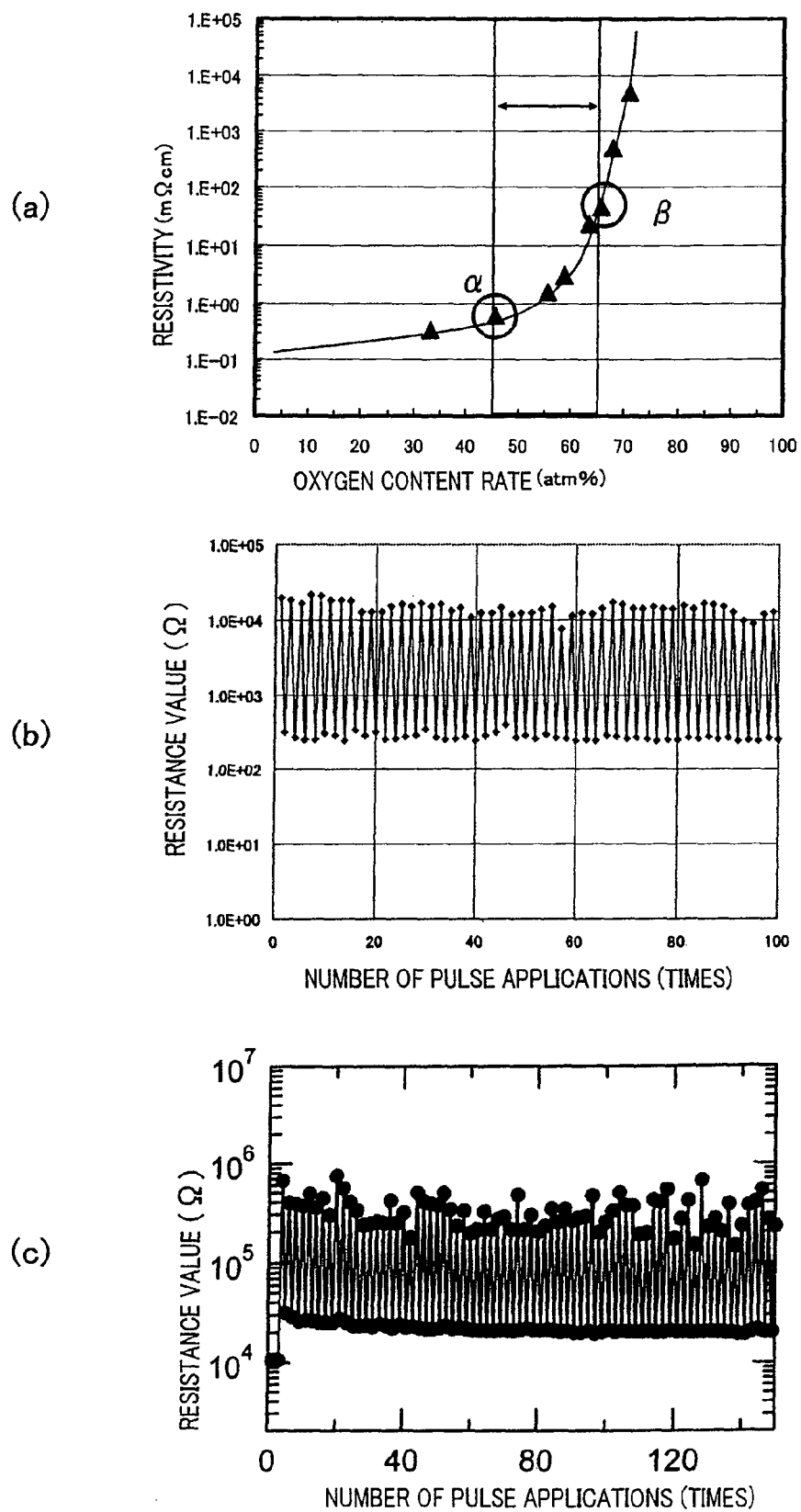
FIG. 11 is a view showing a relationship between the oxygen content rate and a resistance varying characteristic of the resistance variable layer included in the nonvolatile memory element according to Embodiment 1 of the present invention.

FIG. 11 is a view showing a resistance varying characteristic in a composition range in which the oxygen content rate of the resistance variable layer is 45 to 65 atm %. FIG. 11(a) is a view showing a relationship between the oxygen content rate and the resistivity. FIG. 11(b) is a view showing a relationship between the number of pulse applications and the resistance value in the case where the oxygen content rate is 45 atm %. FIG. 14(c) is a view showing a relationship between the number of pulse applications and the resistance value in the case where the oxygen content rate is 65 atm %.

According to the measurement of the resistance varying characteristic, in a range of the oxygen content rate from α point (oxygen content rate: 45 atm %) to β point (oxygen content rate: 65 atm %) shown in FIG. 11(a), a high-resistance value was desirably not less than five times as high as a low-resistance value. FIG. 11(b) and FIG. 11(c) show a resistance varying characteristic of the sample having the oxygen content rate at the α point (oxygen content rate: 45 atm %) with respect to the number of pulse applications and show a resistance varying characteristic of the sample having the oxygen content rate at the β point (oxygen content rate: 65 atm %) with respect to the number of pulse applications, respectively. As can be seen from FIGS. 11(b) and 11(c), in both of the oxygen content rate at the α point and the oxygen content rate at the β point, the high-resistance value is desirably not less than five times as high as the low-resistance value. From this measurement result, a desired resistance varying phenomenon is presumably recognized in a range of $0 < x \leq 1.9$ in the case where the resistance variable layer is represented by TaOx. In addition, since the high-resistance value was desirably not less than five times as high as the low-resistance value in the range of the oxygen content rate from the α point (oxygen content rate: 45 atm %) to the β point (oxygen content rate: 65 atm %), this composition range may be regarded as an appropriate composition range which enables the memory element to stably operate. Therefore, the composition range in which the oxygen content rate is 45 to 65 atm %, i.e., the range of x, $0.8 \leq x \leq 1.9$ in the case where the resistance variable layer is represented by TaOx is a more appropriate range of the resistance variable layer (oxygen content rate=45 atm % corresponds to x=0.8, and the oxygen content rate=65 atm % corresponds to x=1.9). In the composition analysis according to the RBS method, the analysis value of the oxygen content has precision of about ±5 atm %. Therefore, the composition range of x contains a measurement error associated with this precision, and in actuality, there may be a possibility that the composition range in which the oxygen content rate is 40 to 70 atm % is this appropriate composition range. Even in the resistance variable layer outside the composition range, the resistance varying phenomenon is confirmed or presumably recognized. However, as compared to the resistance varying phenomenon of the resistance variable layer within this composition range, the resistivity is smaller or larger, and therefore the high-resistance value is considered to be less than five times as high as the low-resistance value. Therefore, it seems that the resistance variable layer outside the composition range makes stable operation of the memory element relatively difficult.

[Scalability]

Figure 12:
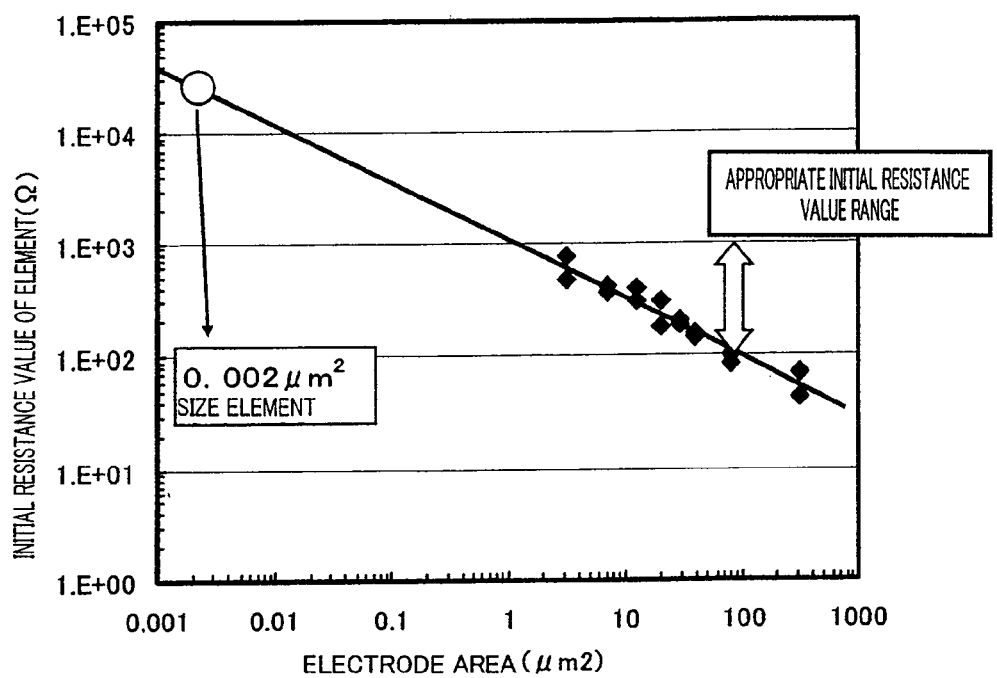
FIG. 12 is a view showing a relationship between an electrode area and an initial resistance value of the nonvolatile memory element according to Embodiment 1 of the present invention.

FIG. 12 shows a relationship between an electrode area and an initial resistance value of the element in a resistance variable layer having a resistivity of, for example, 6 mΩcm. As can be seen from FIG. 12, the resistance value increases as the element area decreases. The resistance varying phenomenon was confirmed in a range in which the initial resistance value of the element is 100 to 1000Ω as shown in FIG. 12. When using the resistance variable films having an equal resistivity, the initial resistance value increases as the element area is made smaller, so that a desired resistance varying phenomenon is not recognized. On the other hand, if the element area is larger, the initial resistance value is lower, and therefore, it is difficult to apply a sufficient voltage to the element. As should be understood from above, it is considered that the initial resistance value of the element has an appropriate range. It is necessary to increase the element area to attain an appropriate initial resistance value in a composition having an oxygen content rate higher than that at β point in FIG. 11. However, increasing the area of the memory element will raise problems associated with cost and voltage application. Therefore, an upper limit is actually set in the oxygen content rate of the resistance variable layer.

On the other hand, in a composition having an oxygen content rate lower than that at α point in FIG. 11, the initial resistance value of the element is expected to fall within an appropriate range if the electrode area is made very smaller. In the future, the size of the memory element is expected to be miniaturized up to an electrode area of $0.002\ \mu m^2$. The initial resistance value of the element having the electrode area of $0.002\ \mu m^2$ is presumed to be $3 \times 10^4 \Omega$ based on an experiment value (actually measured value) of FIG. 12. This value is about 30 times higher than the upper limit value of the appropriate initial resistance value. It is therefore required that the resistivity be approximately $0.2\ m\Omega\ cm$ which is obtained by lowering $6\ m\Omega cm$ of the resistivity in the present case, about 1/30 times, in order to attain the appropriate initial resistance value. As can be seen from FIG. 10, the oxygen content rate of the resistance variable layer having such a resistivity is about 33 atm % (oxygen content rate at a measurement point of a minimum oxygen content rate of FIG. 10), that is, $x=0.5$ when the resistance variable layer is represented by $TaO_x$. From the above, in view of the miniaturization of the nonvolatile memory element of the present invention in the future, it may be considered that the appropriate composition range of the $TaO_x$ forming the resistance variable layer is $0.5 \leq x \leq 1.9$.

[Relationship Between a Width of an Electric Pulse Applied and a Resistance Value]

Subsequently, a relationship between a width of electric pulses applied between electrodes and a resistance value of the resistance variable layer 104 in the nonvolatile memory element 100 of this embodiment will be described.

Figure 13:
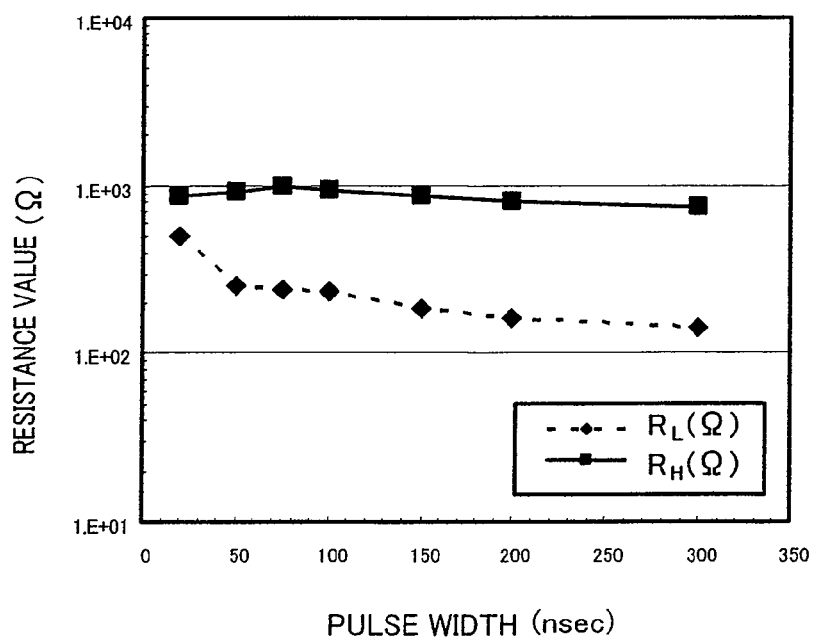
FIG. 13 is a view showing a relationship between a width of electric pulses applied between electrodes and a resistance value of a resistance variable layer in a case where the nonvolatile memory element according to Embodiment 1 of the present invention operates.

FIG. 13 is a view showing the relationship between the width of the electric pulses applied between electrodes and the resistance value of the resistance variable layer in a case where the nonvolatile memory element according to Embodiment 1 of the present invention operates. In FIG. 13, RH denotes a high-resistance value and RL denotes a low-resistance value. Note that each of RH and RL is an average value of the resistance values of the resistance variable layer 104 which are obtained when an electric pulse having each pulse width is applied 100 times.

As shown in FIG. 13, even when the electric pulse applied is a high-speed pulse whose pulse width is, for example, 20 nsec, the resistance varying phenomenon can be confirmed. The value of RH is substantially constant in a range from 20 nsec to 300 nsec. On the other hand, the value of RL tends to be higher when the pulse width is 20 nsec.

[Imprinting Characteristic]

The imprinting characteristic of the resistance value set in the nonvolatile memory element 100 of this embodiment in the case where the same polarity of electric pulses are applied continuously between the electrodes is preferable. For example, when positive and negative electric pulses are applied alternately continuously after negative pulses are applied continuously 20 times between electrodes of the nonvolatile memory element 100 to generate the low-resistance state continuously, the high-resistance state or the low-resistance state is repeated stably. Also, when positive and negative electric pulses are applied alternately continuously after positive pulses are applied continuously 20 times to generate the high-resistance state continuously, the high-resistance state or the low-resistance state is repeated stably in the same manner. From the above results, so-called imprinting resistance of the nonvolatile memory element 100 of this embodiment is high, and therefore the element 100 is expected to stably operate.

[Retention Characteristic of Nonvolatile Memory Element]

For the nonvolatile memory element according to Embodiment 1 of the present invention, variations in the resistance value were measured under high-temperature environments. When the element was set in the low-resistance state, the resistance value did not substantially vary as compared to the initial resistance value, while when the element was set in the high-resistance value, the resistance value varied as compared to the initial resistance value. From this, it can be understood that the retention characteristic of the nonvolatile memory element according to Embodiment 1 of the present invention is determined by how the resistance value of the high-resistance state varies. When the retention time is estimated from the time taken to reach the resistance value which is the middle of the high-resistance value and the low-resistance value in the initial state, the retention time of the nonvolatile memory element according to this embodiment is 100 hours or longer, when it is held at a high temperature of 180° C. Therefore, it may be considered that the nonvolatile memory element has very high retention characteristic.

[Electrode Material]

Figure 14:
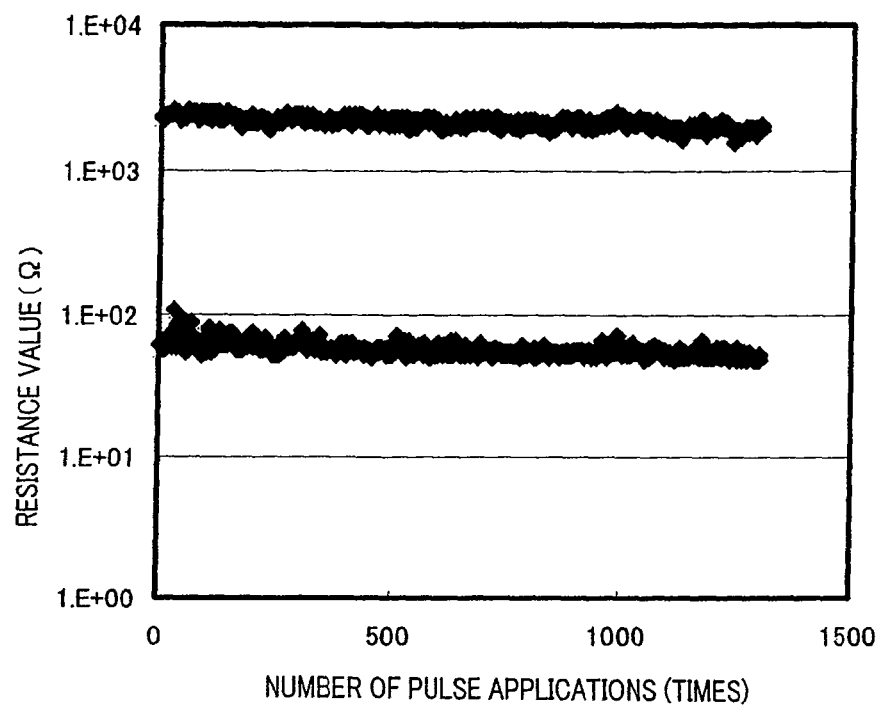
FIG. 14 is a view showing a resistance varying characteristic associated with pulse applications in a case where a first electrode layer is made of Pt and a second electrode layer is made of Ir in the nonvolatile memory element according to Embodiment 1 of the present invention.
Figure 15:
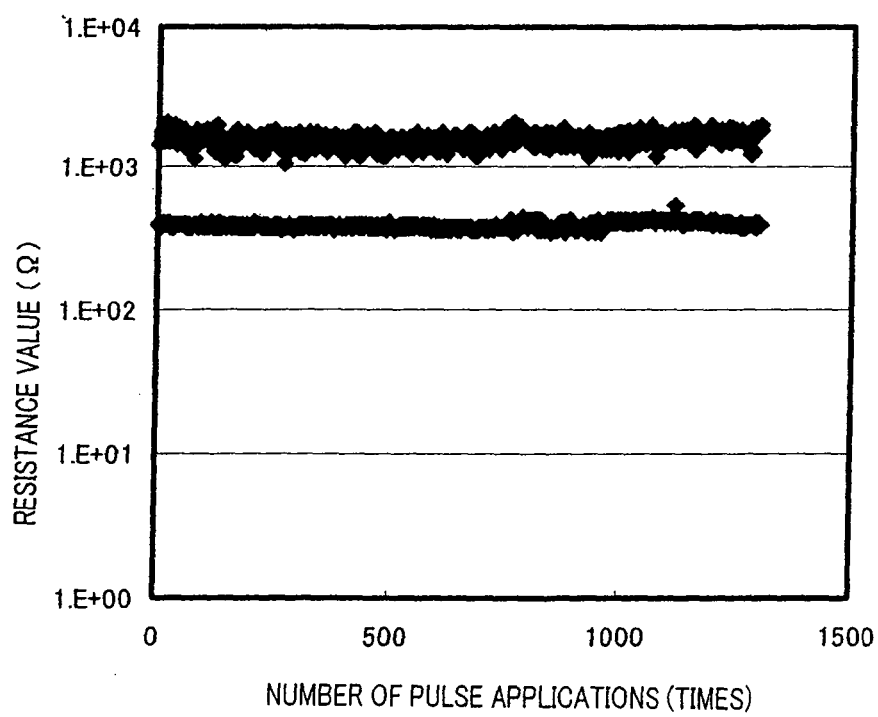
FIG. 15 is a view showing a resistance varying characteristic associated with pulse applications in a case where the first electrode layer is made of Pt and the second electrode layer is made of Cu in the nonvolatile memory element according to Embodiment 1 of the present invention.
Figure 16:
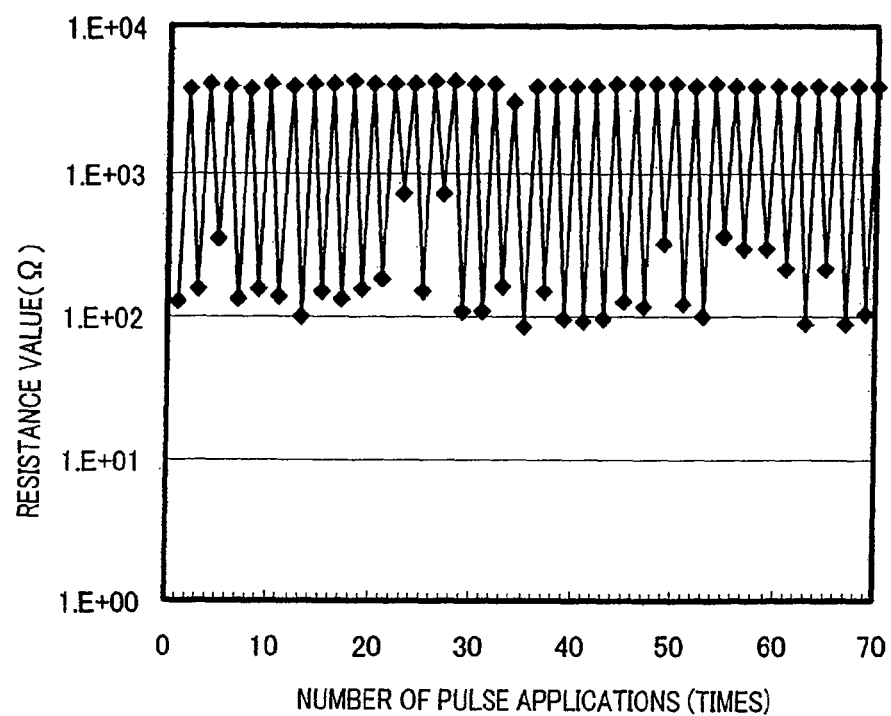
FIG. 16 is a view showing a resistance varying characteristic associated with pulse applications in a case where the first electrode layer is made of Pt and the second electrode layer is made of Au in the nonvolatile memory element according to Embodiment 1 of the present invention.
Figure 17:
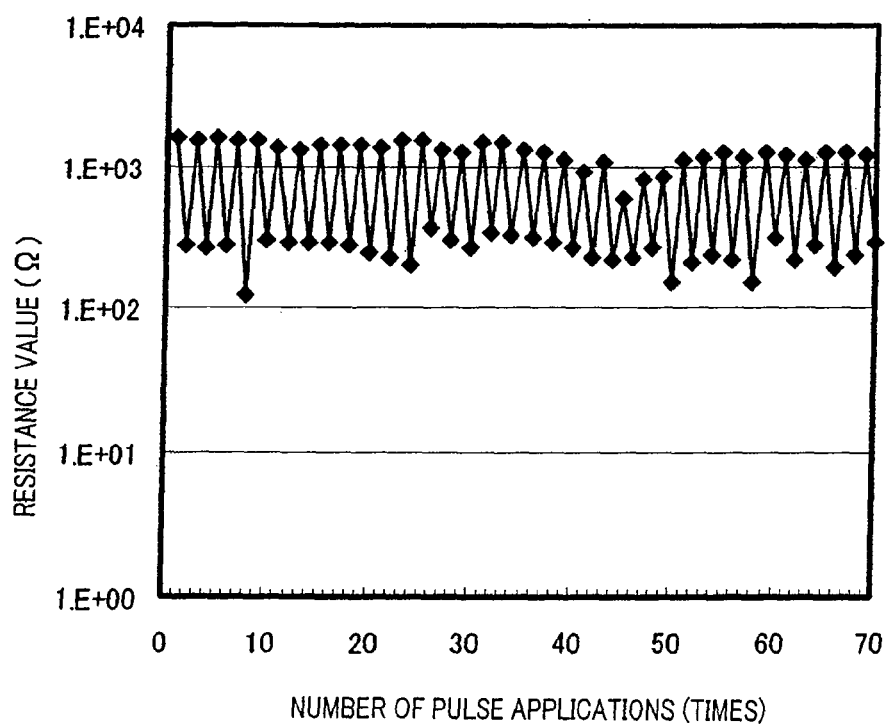
FIG. 17 is a view showing a resistance varying characteristic associated with pulse applications in a case where the first electrode layer is made of Pt and the second electrode layer is made of Ag in the nonvolatile memory element according to Embodiment 1 of the present invention.
Figure 18:
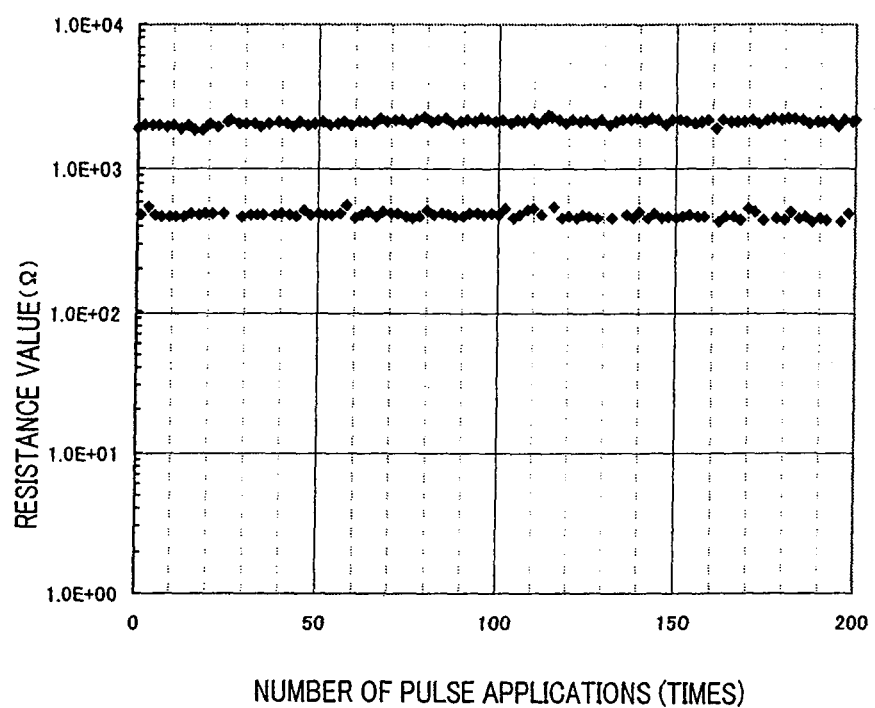
FIG. 18 is a view showing a resistance varying characteristic associated with pulse applications in a case where the first electrode layer is made of Pt and the second electrode layer is made of TiN in the nonvolatile memory element according to Embodiment 1 of the present invention.

In the nonvolatile memory element according to Embodiment 1 of the present invention, Ir, Cu, Au, Ag, TiN, TiAlN may be suitably used for the first electrode layer or the second electrode layer, in addition to Pt. FIG. 14 shows a resistance varying characteristic associated with pulse applications in a case where the first electrode layer is made of Pt and the second electrode layer is made of Ir. FIG. 15 shows a resistance varying characteristic associated with pulse applications in a case where the first electrode layer is made of Pt and the second electrode layer is made of Cu. FIG. 16 shows a resistance varying characteristic associated with pulse applications in a case where the first electrode layer is made of Pt and the second electrode layer is made of Au. FIG. 17 shows a resistance varying characteristic associated with pulse applications in a case where the first electrode layer is made of Pt and the second electrode layer is made of Ag. FIG. 18 shows a resistance varying characteristic associated with pulse applications in a case where the first electrode layer is made of Pt and the second electrode layer is made of TiN. The electrode materials of Ir, Cu, Au, Ag, and TiN corresponding to FIGS. 14 to 18 were produced as in Pt. The application pulse was 100 nsec. As can be seen from FIGS. 14 to 18, in all the cases where the first electrode layer and the second electrode layer are made of materials selected from among the above described electrode materials, desired resistance varying phenomenon was confirmed.

In this embodiment, as shown in FIG. 1, the resistance variable layer 104 is sandwiched between the first electrode layer 103 located below and the second electrode layer 105 located above, and both end portions of the resistance variable layer 104 conform to both end portions of the second electrode layer 105 in a cross-sectional view. This is merely exemplary and the present invention is not limited to such a configuration.

Figure 19:
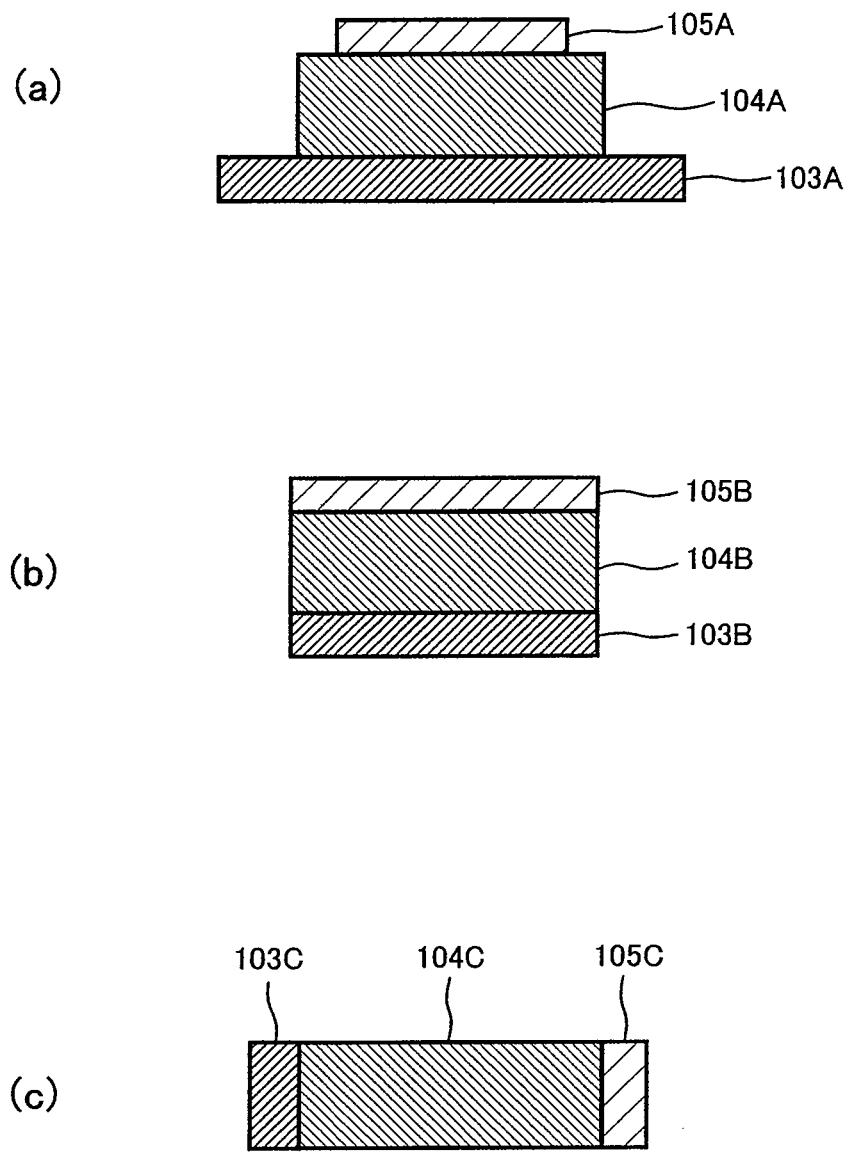
FIG. 19 is a cross-sectional view showing a configuration of Modification of the nonvolatile memory element according to Embodiment 1 of the present invention.

FIGS. 19(a) to 19(c) are cross-sectional views showing configurations of Modifications of the nonvolatile memory element according to Embodiment 1 of the present invention. In FIGS. 19(a) to 19(c), the substrate and the oxide layer are omitted for the sake of convenience.

In Modification shown in FIG. 19(a), a first electrode layer 103A, a resistance variable layer 104A, and a second electrode layer 105A are stacked in this order, and both end portions of the first electrode layer 103A, the resistance variable layer 104A, and the second electrode layer 105A do not conform to each other in a cross-sectional view. On the other hand, in Modification shown in FIG. 19(b), a first electrode layer 103B, a resistance variable layer 104B, and a second electrode 105B are stacked in this order in the same manner, but both end portions of each of the first electrode layers 103B, the resistance variable layer 104B, and the second electrode layer 105B conform to each other in a cross-sectional view. The nonvolatile memory element of the present invention may be configured in this way.

Whereas in the nonvolatile memory element 100 and the above two modifications, the resistance variable layer is sandwiched between electrodes located above and below, electrodes may be formed on both edge surfaces of the resistance variable layer to flow a current in a direction parallel to a main surface of the resistance variable layer. To be specific, as shown in FIG. 19(c), a first electrode 103C may be formed on one edge surface of a resistance variable layer 104C and a second electrode 105C may be formed on the other edge surface thereof so that a current flows in a direction parallel to a main surface of the resistance variable layer 104C.

Although not shown, the nonvolatile memory element according to this embodiment includes an insulating layer (interlayer insulation fim). As the insulating layer, a fluorine-doped oxide film may be formed by a CVD process or the like. Alternatively, the insulating layer may be omitted.

Likewise, although not shown, the nonvolatile memory element according to this embodiment includes a wire layer. As a wire material, for example, Al, W, or Cu may be used. Alternatively, the wire layer may be omitted.

Embodiment 2

The above described nonvolatile memory element according to Embodiment 1 is applicable to nonvolatile semiconductor apparatuses having various configurations. A semiconductor apparatus according to Embodiment 2 is a nonvolatile memory apparatus which includes the nonvolatile memory element according to Embodiment 1 and is a cross-point type memory apparatus in which an active layer intervenes at an intersection (three-dimensional cross-point) between a word line and a bit line.

[Configuration of Semiconductor Apparatus According to Embodiment 2]

Figure 20:
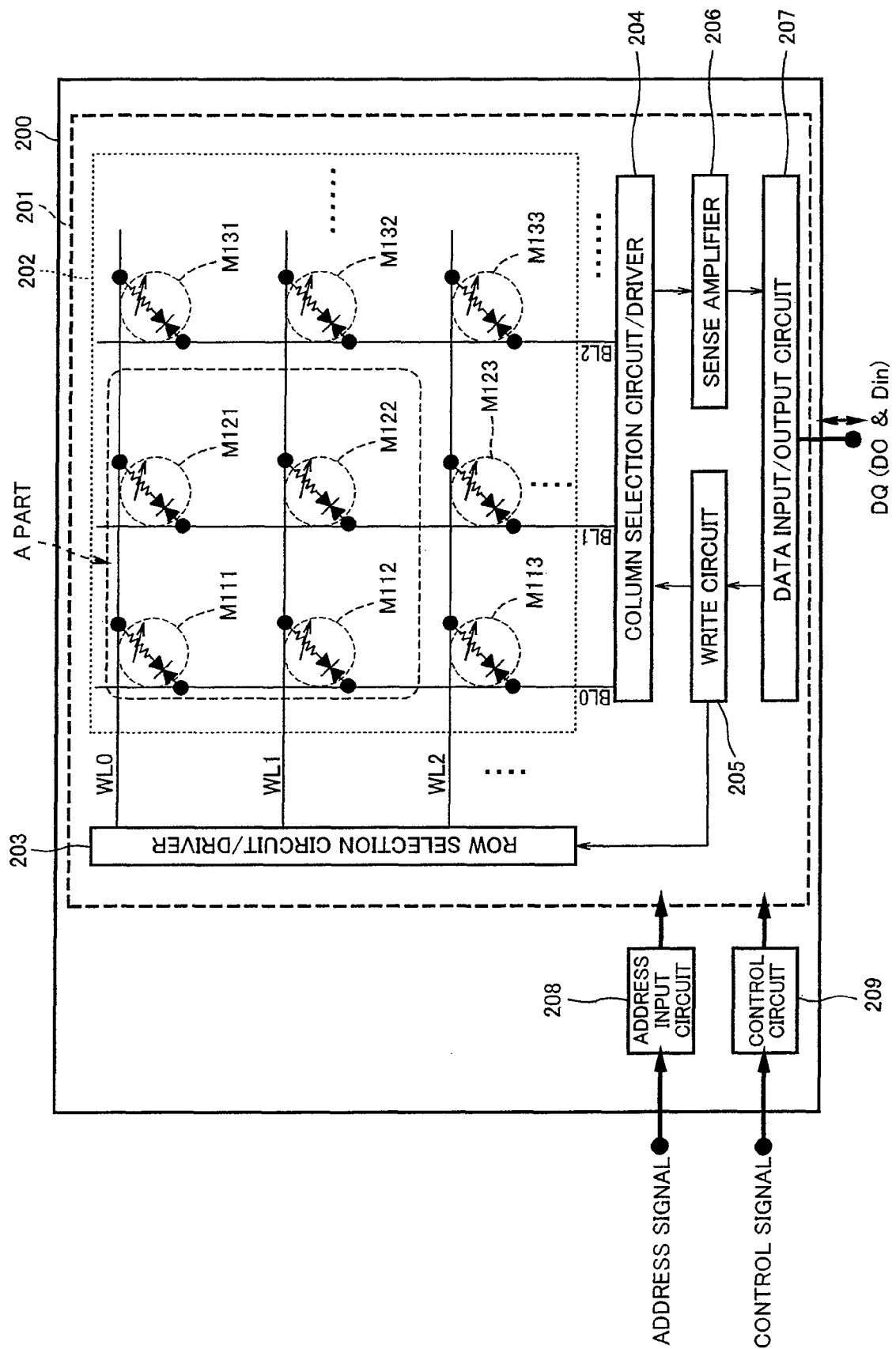
FIG. 20 is a block diagram showing a configuration of a nonvolatile memory apparatus according to Embodiment 2 of the present invention.
Figure 21:
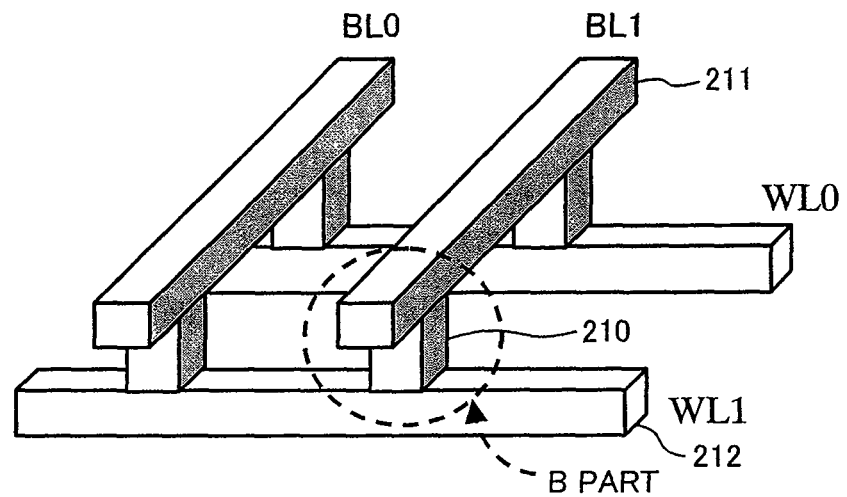
FIG. 21 is a perspective view showing a configuration (configuration corresponding to 4 bits) in A part of FIG. 20.

FIG. 20 is a block diagram showing a configuration of a nonvolatile memory apparatus according to Embodiment 2 of the present invention. FIG. 21 is a perspective view showing a configuration (configuration corresponding to 4 bits) in A part of FIG. 20.

As shown in FIG. 20, a nonvolatile memory apparatus 200 according to this embodiment includes a memory main body 201 on a semiconductor substrate. The memory main body 202 includes a memory array 202, a row selection circuit/driver 203, a column selection circuit/driver 204, a write circuit 205 for writing data, a sense amplifier 206 which detects an amount of a current flowing in a selected bit line and determines the data as "1" or "0" and a data input/output circuit 207 which executes input/output process of input/output data via a terminal DQ. The nonvolatile memory apparatus 200 further includes an address input circuit 208 which receives an address signal externally input, and a control circuit 209 for controlling the operation of the memory main body 201, based on a control signal externally input.

As shown in FIGS. 20 and 21, the memory array 202 includes a plurality of word lines WL1, WL2, WL3, ... which are formed on the semiconductor substrate to extend in parallel with each other, and a plurality of bit lines BL0, BL1, BL2, ... which are formed above the plurality of word lines WL0, WL1, WL2, ..., so as to extend in parallel with each other within a plane parallel to a main surface of the semiconductor substrate and so as to three-dimensionally cross the plurality of word lines WL0, WL1, WL2, ....

Further, a plurality of memory cells M111, M112, M113, M121, M122, M123, M131, M132, M133, ... (hereinafter expressed as "memory cells M111, MC112, ...") are provided in matrix so as to respectively correspond to the three-dimensional cross-points of the plurality of word lines WL0, WL1, WL2, ..., and the plural bit lines BL0, BL1, BL2 ....

The memory cells M111, M112, ... correspond to the nonvolatile memory element according to Embodiment 1, and each of them has the resistance variable layer comprising tantalum oxide. It should noted that in this embodiment, each of these memory cells M111, M112, ... includes a current restricting element as described later.

The memory cells M111, M112, ... in FIG. 20 are identified by reference numeral 210 in FIG. 21.

The address input circuit 208 receives an address signal from an external circuit (not shown), and outputs a row address signal and a column address signal to the row selection circuit/driver 203 and to the column selection circuit/driver 204, respectively, based on the address signal. The address signal is a signal indicating the address of a specified memory cell to be selected from among the plurality of memory cells M111, M112, .... The row address signal is a signal indicating the address of a row in the address indicated by the address signal, and the column address signal is a signal indicating the address of a column in the address indicated by the address signal.

In a write cycle of data, the control circuit 209 outputs to the write circuit 205, a write signal for causing application of a write voltage, according to the input data Din input to the data input/output circuit 207. In a readout cycle of data, the control circuit 209 outputs to the column selection circuit/driver 204, a readout signal for causing application of a readout voltage.

The row selection circuit/driver 203 receives the row address signal output from the address input circuit 208, selects one from among the plurality of word lines WL0, WL1, WL2, ... based on the row address signal and applies a predetermined voltage to the selected word line.

The column selection circuit/driver 204 receives a column address signal output from the address input circuit 208, selects one from among the plurality bit lines BL0, BL1, BL2, ... based on the column address signal and applies the write voltage or the readout voltage to the selected bit line.

Receiving the write signal output from the control circuit 209, the write circuit 205 outputs to the row selection circuit/driver 203, a signal for causing application of a voltage to the selected word line, and outputs to the column selection circuit/driver 204 a signal for causing application of a write voltage to the selected bit line.

In the readout cycle of data, the sense amplifier 206 detects an amount of a current flowing in the selected bit line which is a readout target, and determines the data as "1" or "0." The resulting output data DO is output to the external circuit via the data input/output circuit 207.

[Configuration of Nonvolatile Memory Element Included in Nonvolatile Memory Apparatus According to Embodiment 2]

Figure 22:
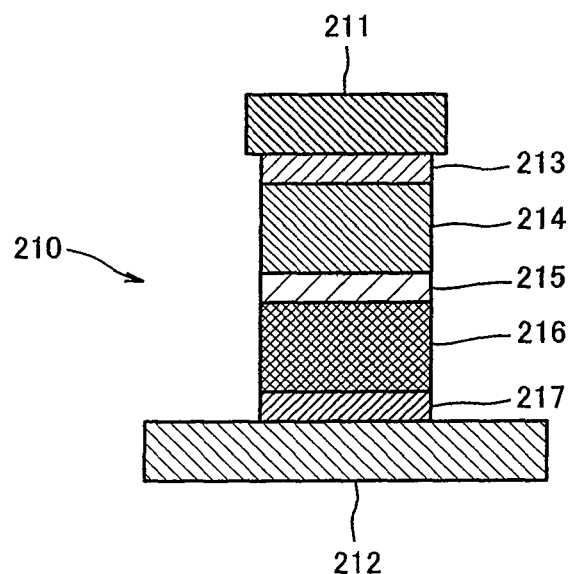
FIG. 22 is a cross-sectional view showing a configuration of a nonvolatile memory element included in a nonvolatile memory apparatus according to Embodiment 2 of the present invention.

FIG. 22 is a cross-sectional view showing a configuration of the nonvolatile memory element included in the nonvolatile memory apparatus according to Embodiment 2 of the present invention. In FIG. 22, a configuration of B part in FIG. 21 is shown.

As shown in FIG. 22, a nonvolatile memory element 210 included in the nonvolatile memory apparatus according to this embodiment intervenes between a lower wire 212 (corresponding to the word line WL1 of FIG. 21) which is a copper wire and an upper wire 211 (corresponding to the bit line BL1 in FIG. 21) which is a copper wire, and includes a lower electrode 217, a current restricting element 216, an inner electrode 215, a resistance variable layer 214, and an upper electrode 213 which are stacked in this order.

The inner electrode 215, the resistance variable layer 214, and the upper electrode 213 correspond to the first electrode layer 103, the resistance variable layer 104, and the second electrode layer 105 in the nonvolatile memory element 100 according to Embodiment 1 shown in FIG. 1, respectively. Therefore, the resistance variable layer 214 is formed as in Embodiment 1.

The current restricting element 216 is connected in series to the resistance variable layer 214 via the inner electrode 215 made of TaN. The current restricting element 216 is electrically connected to the resistance variable layer 214. The current restricting element 216 is an element which is typified by a MIM (Metal-Insulator-Metal) diode or a MSM (Metal-Semiconductor-Metal) diode, and shows a nonlinear current characteristic with respect to a voltage. The current restricting element 216 has a bidirectional current characteristic with respect to a voltage, and is placed in a conductive state under a predetermined threshold voltage Vf (e.g., +1V or higher or −1V or lower based on one electrode as a reference).

Tantalum and its oxide are materials generally used in a semiconductor process, and may have very high affinity with the semiconductor process. Therefore, they can be easily incorporated into the existing semiconductor manufacturing process.

[Configuration of Modification of Nonvolatile Memory Element Included in Nonvolatile Memory Apparatus According to Embodiment 2]

The configuration of the nonvolatile memory element included in the nonvolatile memory apparatus according to this embodiment is not limited to that shown in FIG. 22, but may have a configuration shown below.

FIGS. 23(a) to 23(g) are cross-sectional views showing configurations of Modifications of the nonvolatile memory element included in the nonvolatile memory apparatus according to Embodiment 2 of the present invention.

Figure 23:
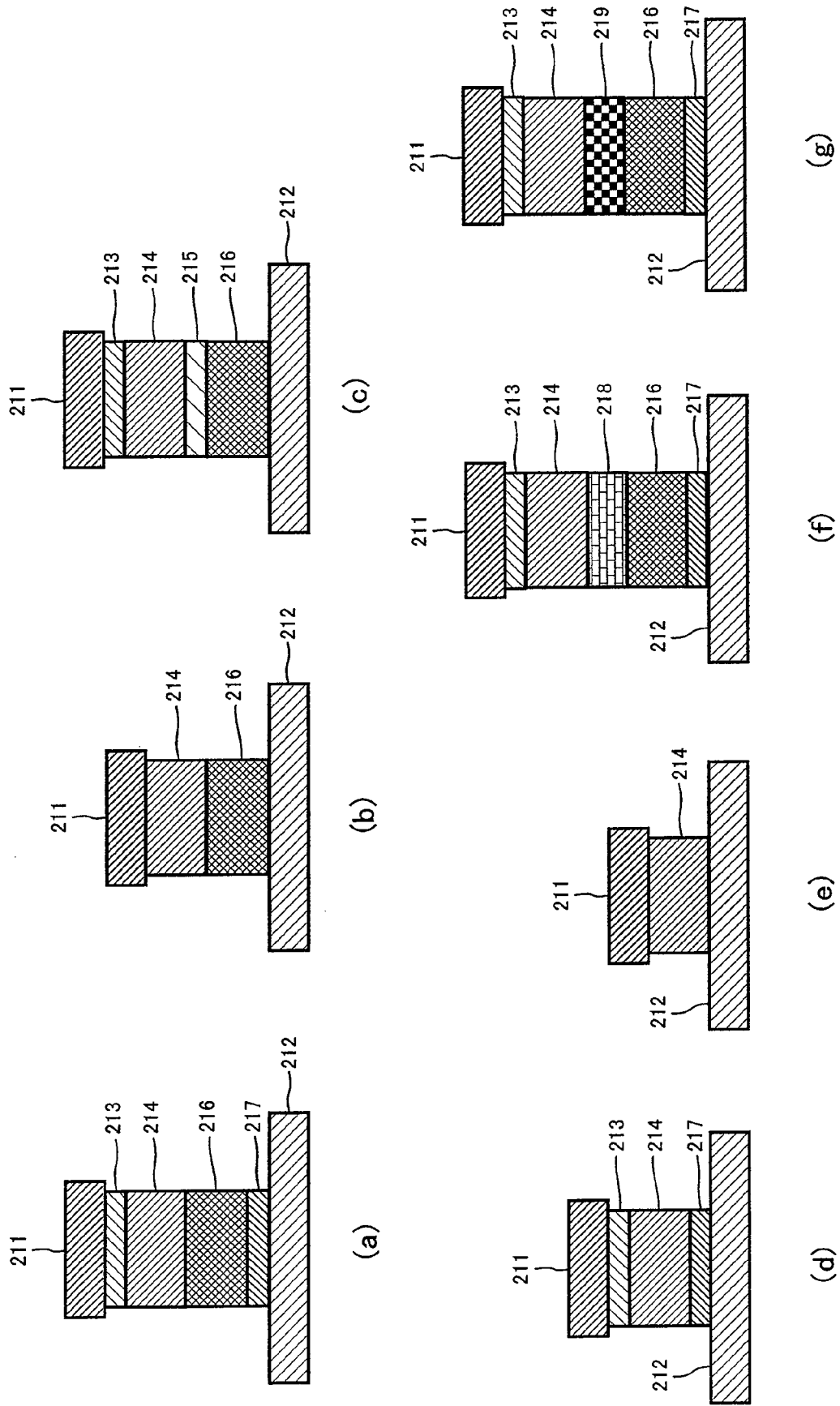
FIG. 23 is a cross-sectional view showing a configuration of Modification of the nonvolatile memory element included in the nonvolatile memory apparatus according to Embodiment 2 of the present invention.

FIG. 23(a) shows a configuration in which the resistance variable layer 214 is formed on the current restricting element 216, and the inner electrode is omitted, unlike the configuration of FIG. 22.

FIG. 23(b) shows a configuration in which the resistance variable layer 214 is formed on the current restricting element 216, and the lower electrode, the inner electrode, and the upper electrode are omitted, unlike the configuration of FIG. 22. FIG. 23(c) shows a configuration in which the lower electrode is omitted, unlike the configuration of FIG. 22. Alternatively, a configuration in which the upper electrode is omitted may be used.

FIG. 23(d) shows a configuration in which the inner electrode and the current restricting element are omitted, unlike the configuration of FIG. 22. FIG. 23(e) shows a configuration in which the upper electrode and the lower electrode are further omitted.

FIG. 23(f) shows a configuration in which the inner electrode is omitted but instead an ohmic resistance layer 218 is provided unlike the configuration of FIG. 22. FIG. 23(g) shows a configuration in which a second resistance variable layer 219 is provided instead of the inner electrode.

In the above Modifications, in the configuration in which the upper electrode is omitted, the upper wire 211 serves as the upper electrode of the nonvolatile memory element, while in the configuration in which the lower electrode is omitted, the lower wire 212 serves as the lower electrode of the nonvolatile memory element.

When the memory cells are fewer in number, a current flowing to an unselected memory cell due to crosstalk is reduced. In that case, the above described current restricting element may be dispensed with.

As should be understood from the above, for the nonvolatile memory element included in the nonvolatile memory apparatus according to this embodiment, various configurations may be used.

[Example of Configuration of Nonvolatile Memory Apparatus Having a Multi-Layer Structure]

The memory arrays of the nonvolatile memory apparatus according to this embodiment shown in FIGS. 20 and 21 may be three-dimensionally stacked to form a layered structure, thus attaining a nonvolatile memory apparatus having a multi-layer structure.

Figure 24:
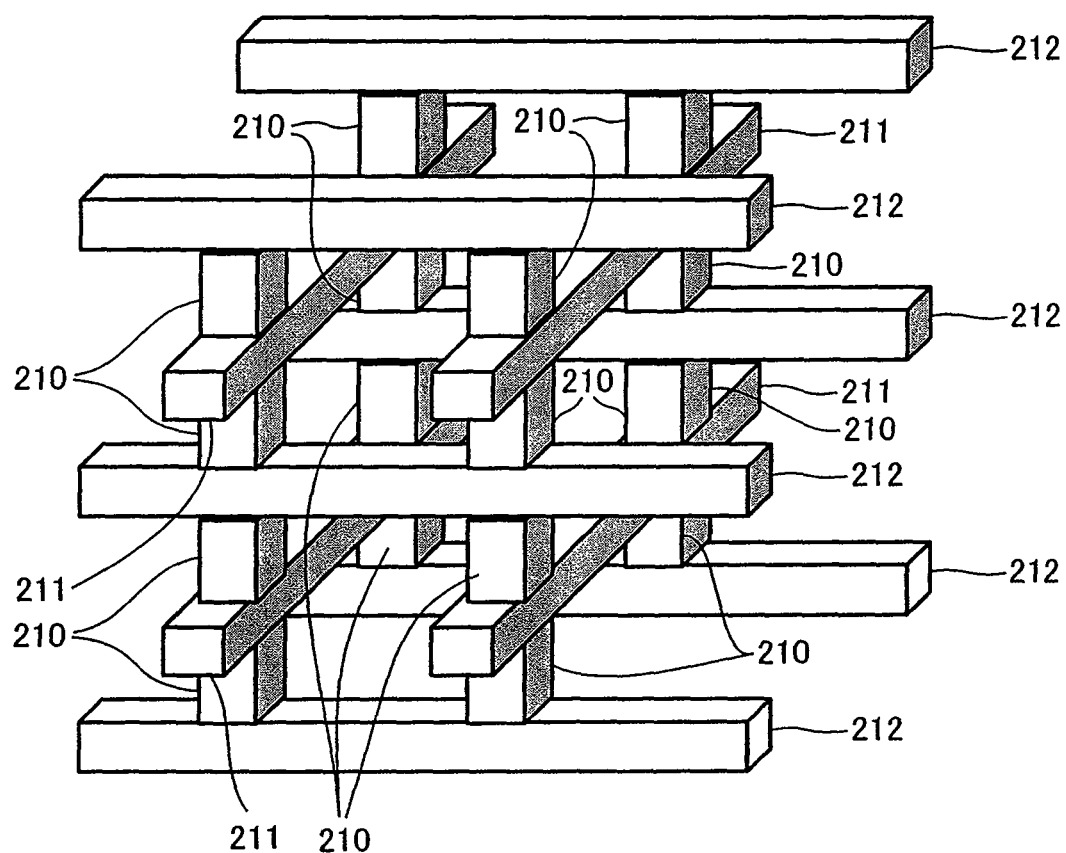
FIG. 24 is a perspective view showing a configuration of a memory array included in a nonvolatile memory apparatus having a multi-layer structure of the present invention.

FIG. 24 is a perspective view showing a configuration of a memory array included in a nonvolatile memory apparatus having the multi-layer structure of the present invention. As shown in FIG. 24, the nonvolatile memory apparatus includes a plurality of memory arrays stacked to form a multi-layer memory array, each of the memory arrays including a plurality of lower wires 212 formed on a semiconductor substrate (not shown), to extend in parallel with each other, a plurality of upper wires 211 formed above the plurality of lower wires 212 so as to extend in parallel with each other within a plane parallel to a main surface of the semiconductor substrate and so as to three-dimensionally cross the plurality of lower wires 212, and a plurality of memory cells 210 provided in matrix to respectively correspond to three-dimensional cross points of the plurality of lower wires 212 and the plurality of upper wires 211.

In the example shown in FIG. 24, the wire layers are formed in five layers and the nonvolatile memory elements provided at the three-dimensional cross points are formed in four layers. Alternatively, the number of these layers may be increased or decreased as desired.

By providing the multi-layer memory array configured as described above, a nonvolatile memory having a very large capacity is attainable.

As already described in Embodiment 1, the resistance variable layer of the present invention can be formed at a low temperature. Therefore, transistors or wire material such as silicide formed in a lower layer step are not affected even when forming a layered structure is performed in a wiring step illustrated in this embodiment. As a result, a multi-layer memory array is easily attainable. That is, a nonvolatile memory apparatus having a multi-layer structure can be easily attained by using the resistance variable layer comprising the tantalum oxide of the present invention.

[Example of Operation of Nonvolatile Memory Apparatus]

Subsequently, an example of the operation of the nonvolatile memory apparatus according to Embodiment 2 in a write cycle in which data is written and in a readout cycle in which data is read out, will be described with reference to a timing chart shown in FIG. 25.

Figure 25:
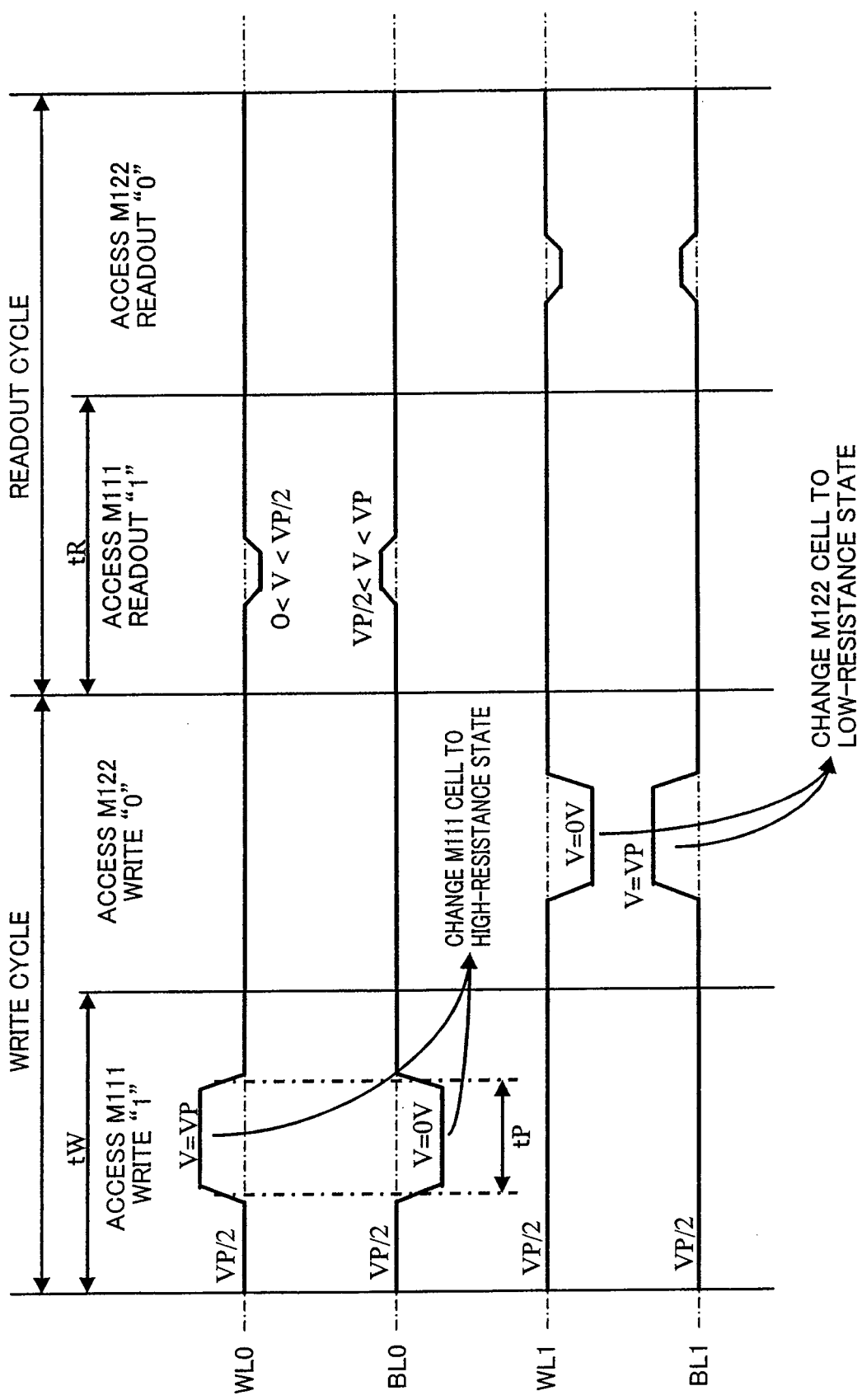
FIG. 25 is a timing chart showing an example of an operation of the nonvolatile memory apparatus according to Embodiment 2 of the present invention.

FIG. 25 is a timing chart showing an example of the operation of the nonvolatile memory apparatus according to Embodiment 2 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, writing and reading out of data with respect to the memory cells M111 and M112 are described.

VP in FIG. 25 denotes a pulse voltage required to enable the memory cell including the resistance variable element and the current restricting element to change its resistance. It is desired that a relationship VP/2<threshold voltage Vf be established. This is because, this relationship can suppress a leak current flowing to an unselected memory cell due to crosstalk. This makes it possible to reduce a current supplied to a memory cell which does not require writing of data, facilitating achievement of low electric power consumption. In addition, unintended superficial writing (generally referred to as disturb) to the unselected memory cell is advantageously suppressed.

In FIG. 25, tW denotes a write cycle time which is a time required for one write cycle, and tR denotes a readout cycle time which is a time required for one readout cycle.

In a write cycle for the memory cell M111, a pulse voltage VP having a pulse width tP is applied to the word line WL0, and according to this timing, a voltage of 0V is applied to the bit line BL0 in the same manner. In this way, a write voltage for writing data "1" is applied to the memory cell M111, causing the resistance variable layer in the memory cell M111 to be turned to the high-resistance state. That is, the data "1" is written to the memory cell M111.

Then, in a write cycle for the memory cell M122, a voltage of 0V having a pulse width tP is applied to the word line WL1, and according to this timing, the pulse voltage VP is applied to the bit line BL1 in the same manner. In this way, a write voltage for writing data "0" is applied to the memory cell M122, causing the resistance variable layer in the memory cell M122 to be turned to the low-resistance state. That is, the data "0" is written to the memory cell M122.

In a readout cycle for the memory cell M111, a pulse voltage which has an amplitude smaller than that of the pulse for writing and has a value larger than 0V and smaller than VP/2 is applied to the word line WL0. According to this timing, a pulse voltage which has an amplitude smaller than that of the pulse for writing and has a value larger than VP/2 and smaller than VP is applied to the bit line BL0. Thereby, a current corresponding to the resistance value of the resistance variable layer 214 in the memory cell M111 turned to the high-resistance state is output, and its output current value is detected, so that the data "1" is read out.

Then, in a readout cycle for the memory cell M122, a voltage identical to that in the previous readout cycle for the memory cell M111 is applied to the word line WL1 and the bit line BL1. Thereby, a current corresponding to the resistance value of the resistance variable layer 214 in the memory cell M122 turned to the low-resistance state is output, and its output current value is detected, so that the data "0" is read out.

As already described in Embodiment 1, in the case where the resistance variable layer including the tantalum oxide of the present invention is used, the resistance varying phenomenon can be confirmed even when the electric pulses applied between the electrodes is a high-speed pulse having a width of about 20 nsec. Therefore, the pulse width tP may be set to about 50 nsec.

Since the high-speed pulse having a pulse width of about 50 nsec can be used, one write cycle time tW can be set to about 80 nsec, taking operation time of a peripheral circuit such as a control circuit of the nonvolatile memory apparatus 200 into account. In that case, for example, when input/output of data to/from a component outside the nonvolatile memory apparatus 200 via the terminal DQ of the data input/output circuit 207, is performed with 16 bits, a data transfer speed required for writing the data is 25 Mbite per second, achieving a very high-speed write operation. Furthermore, a higher-speed write operation can be achieved by increasing parallel write bits in number inside the nonvolatile memory apparatus, by using a known method such as a page mode or a burst mode.

Among conventional nonvolatile memories, in the case of a NAND flash memory which is known to be capable of data transfer at a relatively high speed, a data transfer speed required for writing is about 10 Mbites per second, even if the page mode is used. From this fact, achievement of the high-speed of the write operation of the nonvolatile memory apparatus according to this embodiment can be confirmed.

As already described in Embodiment 1, by using the resistance variable layer including the tantalum oxide of the present invention, the nonvolatile memory element which has a low imprinting characteristic can be attained. To be specific, even in the case where, after the same data is repeatedly written, opposite data is written, rewriting can be performed by applying a high-speed pulse once. This eliminates a need for a step for adjusting different data to identical ones before writing, which commonly occurs in a delete cycle or a reset cycle which is typically needed in the nonvolatile memory element. This contributes to achievement of a higher-speed of the writing in the nonvolatile memory apparatus according to this embodiment. Since such a step is dispensed with, the write operation can be performed with a simple step.

Since a voltage which is as low as 2 to 3V is sufficient as the write voltage, low electric power consumption can be realized.

In this embodiment, only the cross-point structure formed by integration on the semiconductor substrate is described. Alternatively, the cross-point structure may be formed on a more inexpensive substrate such as a plastic substrate, in place of the semiconductor substrate, and may be applied to a memory apparatus which has a layered structure formed by an assembling method using bumps.

Embodiment 3

A nonvolatile memory apparatus according to Embodiment 3 is a nonvolatile memory apparatus which includes the nonvolatile memory element according to Embodiment 1, and is of a one transistor/one nonvolatile memory portion type.

[Configuration of Nonvolatile Memory Apparatus According to Embodiment 3]

Figure 26:
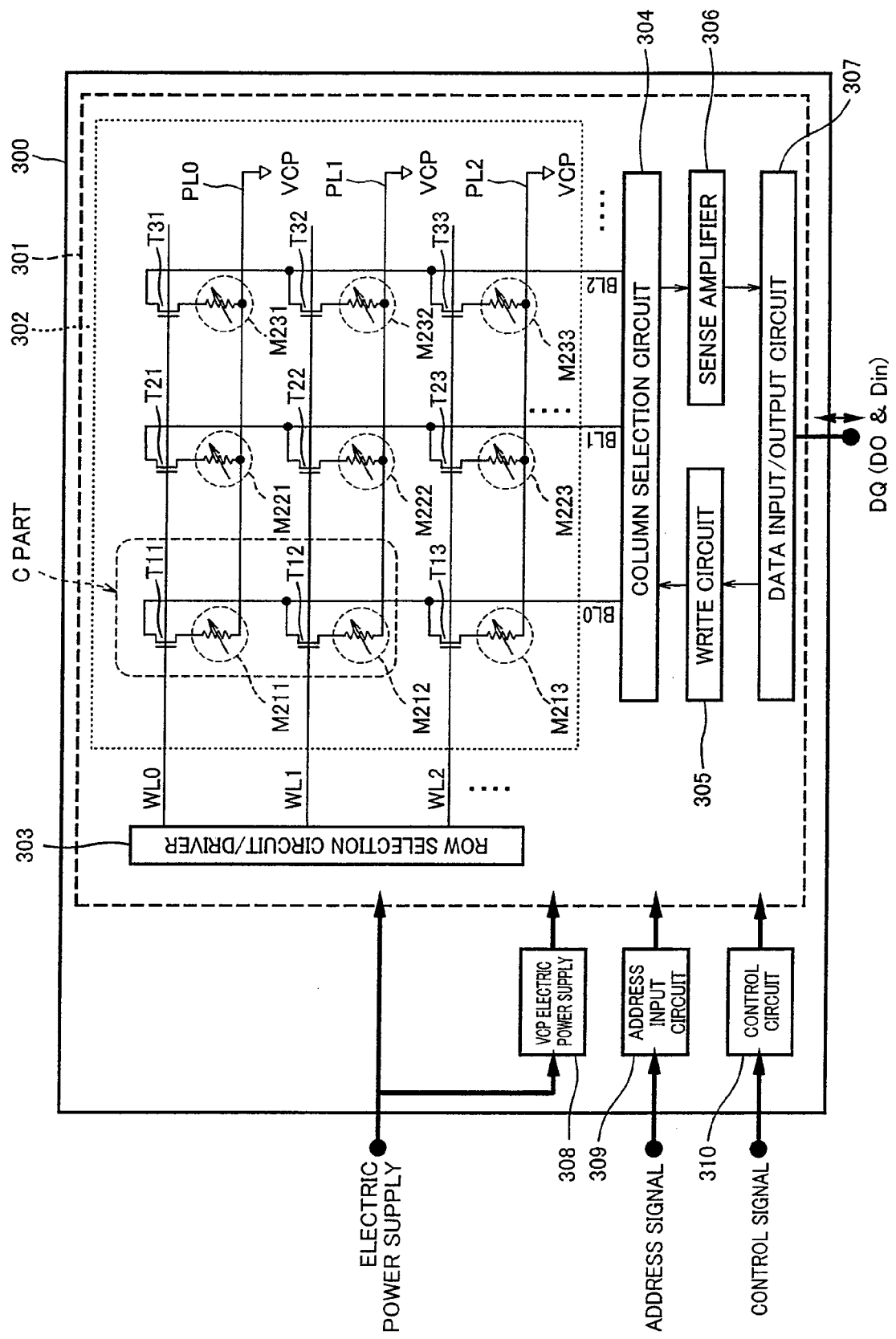
FIG. 26 is a block diagram showing a configuration of a nonvolatile memory apparatus according to Embodiment 3 of the present invention.
Figure 27:
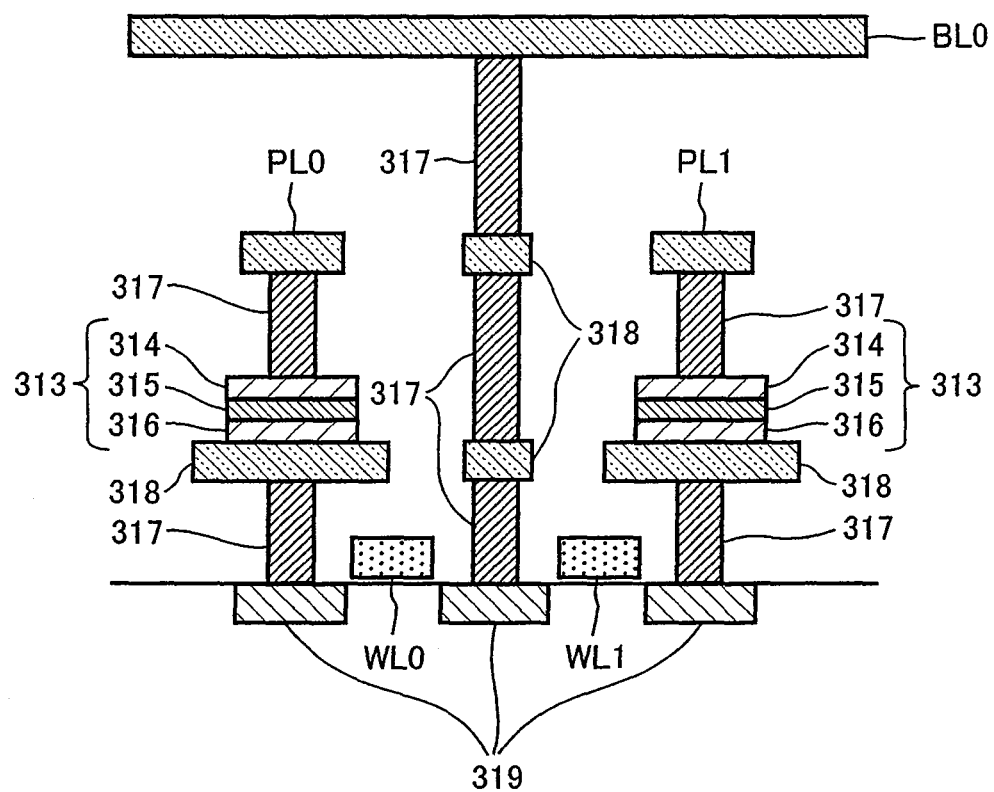
FIG. 27 is a cross-sectional view showing a configuration (configuration corresponding to 2 bits) in C part of FIG. 26.

FIG. 26 is a block diagram showing a configuration of a nonvolatile memory apparatus according to Embodiment 3 of the present invention. FIG. 27 is a cross-sectional view showing a configuration (configuration corresponding to 2 bits) in C part of FIG. 26.

As shown in FIG. 26, a nonvolatile memory apparatus 300 according to this embodiment includes a memory main body 301 on a semiconductor substrate. The memory main body 301 includes a memory array 302, a row selection circuit/driver 303, a column selection circuit 304, a write circuit 305 for writing data, a sense amplifier 306 which detects an amount of a current flowing in a selected bit line and determines the data as "1" or "0," and a data input/output circuit 307 which executes input/output process of input/output data via the terminal DQ. The nonvolatile memory apparatus 300 further includes a cell plate electric power supply (VCR electric power supply) 308, an address input circuit 309 which receives an address externally input, and a control circuit 310 for controlling the operation of the memory main body 301, based on the control signal externally input.

The memory array 302 includes the plurality of word lines WL0, WL1, WL2, . . . and the plurality of bit lines BL0, BL1, BL2, . . . which are formed on the semiconductor substrate and are arranged to three-dimensionally cross each other, a plurality of transistors T11, T12, T13, T21, T22, T23, T31, T32, T33, . . . (hereinafter expressed as "transistors T11, T12, . . . ") provided to respectively correspond to intersections of the word lines WL0, WL1, WL2, . . . and the bit lines BL0, BL1, BL2, . . . , and a plurality of memory cells M211, M212, . . . (hereinafter expressed as "memory cells M211, M212, . . . " provided to respectively correspond to the transistors T11, T12, . . . .

The memory array 302 further includes a plurality of plate lines PL0, PL1, PL2, . . . which are arranged to extend in parallel with the word lines WL0, WL1, WL2, . . . .

As shown in FIG. 27, the bit line BL0 is disposed above the word lines WL0 and WL1, and the plate lines PL0 and PL1 are disposed between the word lines WL0 and WL1 and the bit line BL0.

Each of the memory cells M211, M212, . . . corresponds to the nonvolatile memory element according to Embodiment 1, and includes a resistance variable layer comprising tantalum oxide. To be specific, the nonvolatile memory element 313 in FIG. 27 corresponds to the memory cells M211, M212, . . . in FIG. 26, and is constituted by the upper electrode 314, the resistance variable layer 315 comprising tantalum oxide, and the lower electrode 316.

In FIG. 27, 317 denotes a plug layer, 318 denotes a metal wire layer, and 319 denotes source/drain regions.

As shown in FIG. 26, drains of the transistors T11, T12, T13, . . . are connected to the bit line BL0, drains of the transistors T21, T22, T23, . . . are connected to the bit line BL1, and drains of the transistors T31, T32, T33, . . . are connected to the bit line BL2.

Gates of the transistors T11, T21, T31, . . . are connected to the word line WL0, gates of the transistors T12, T22, T32, . . . are connected to the word line WL1, and gates of the transistors T13, T23, T33, . . . are connected to the word line WL2.

Sources of the transistors T11, T12, . . . are connected to the memory cells M211, M212, . . . , respectively.

The memory cells M211, M221, M231, . . . are connected to the plate line PL0, the memory cells M212, M222, M232, . . . are connected to the plate line PL1, and the memory cells M213, M223, M233, . . . are connected to the plate line PL2.

The address input circuit 309 receives an address signal from an external circuit (not shown), and outputs a row address signal and a column address signal to the row selection circuit/driver 303 and the column selection circuit 304, respectively, based on the address signal. The address signal is a signal indicating the address of a specified memory cell to be selected from among the plurality of memory cells M211, M212, . . . . The row address signal is a signal indicating the address of a row in the address indicated by the address signal, and the column address signal is a signal indicating the address of a column in the address indicated by the address signal.

In a write cycle of data, the control circuit 310 outputs to the write circuit 305, a write signal for causing application of a write voltage, according to the input data Din input to the data input/output circuit 307. On the other hand, in a readout cycle of data, the control circuit 310 outputs to the column selection circuit 304, a readout signal for causing application of a readout voltage.

The row selection circuit/driver 303 receives the row address signal output from the address input circuit 309, selects one from among the plurality of word lines WL0, WL1, WL2, . . . according to the row address signal, and applies a predetermined voltage to the selected word line.

The column selection circuit 304 receives a column address signal output from the address input circuit 309, selects one from among the plurality bit lines BL0, BL1, BL2, . . . according to the column address signal, and applies the write voltage or the readout voltage to the selected bit line.

Receiving the write signal output from the control circuit 310, the write circuit 305 outputs to the column selection circuit 304, a signal for causing application of the write voltage to the selected bit line.

In the readout cycle of data, the sense amplifier 306 detects an amount of a current flowing in the selected bit line which is a readout target, and determines the data as "1" or "0." The resulting output data DO is output to the external circuit via the data input/output circuit 307.

In Embodiment 3 using the configuration of one transistor/one nonvolatile memory portion, a storage capacity is smaller than that of the configuration using the cross-point type nonvolatile memory portion in Embodiment 2. However, Embodiment 3 may dispense with the current restricting element such as the diode, and therefore is advantageously easily combined with the CMOS process. In addition, operation control therefor is advantageously easy.

As in Embodiment 2, the resistance variable layer of the present invention can be formed at a low temperature. Therefore, it is advantageous that transistors or wire material such as silicide formed in a lower layer step are not affected even when forming a layered structure is performed in a wiring step illustrated in this embodiment.

Furthermore, as in Embodiment 2, since a film forming of tantalum and its oxide are easily incorporated into the existing semiconductor manufacturing process, the nonvolatile memory apparatus of this embodiment can be easily manufactured.

[Example of Operation of Nonvolatile Memory Apparatus]

Subsequently, an example of the operation of the nonvolatile memory apparatus according to Embodiment 3 in a write cycle in which data is written and in a readout cycle in which data is read out, will be described with reference to a timing chart shown in FIG. 28.

Figure 28:
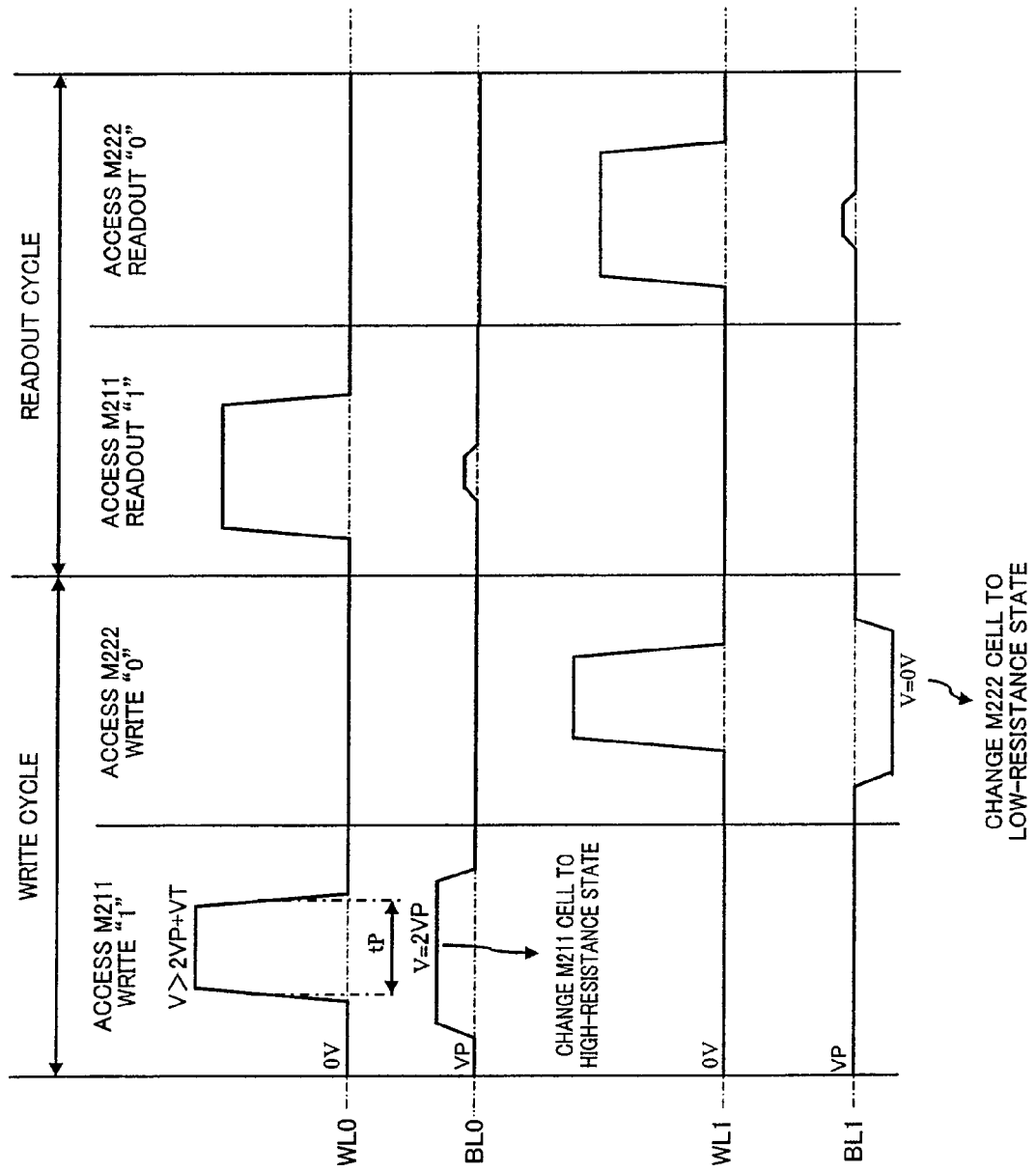
FIG. 28 is a timing chart showing an example of an operation of the nonvolatile memory apparatus according to Embodiment 3 of the present invention.

FIG. 28 is a timing chart showing an example of the operation of the nonvolatile memory apparatus according to Embodiment 3 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, writing and reading out of data with respect to the memory cells M211 and M212 are shown.

In FIG. 28, VP denotes a pulse voltage required to enable the resistance variable element to change its resistance, and VT denotes a threshold voltage of the transistor. The voltage VP is always applied to the plate line, and the bit line is precharged with a voltage VP when it is unselected.

In a write cycle for the memory cell M211, a voltage which is larger than a pulse voltage 2VP+transistor threshold voltage VT and has a pulse width tP is applied to the word line WL0, causing the transistor T11 to be tuned on. According to this timing, a pulse voltage 2VP is applied to the bit line BL0. In this way, a write voltage for writing data "1" is applied to the memory cell M211, causing the resistance variable layer in the memory cell M211 to be turned to the high-resistance state. That is, the data "1" is written to the memory cell M211.

Then, in a write cycle for the memory cell M222, a voltage which is larger than a pulse voltage 2VP+transistor threshold voltage VT and has a pulse width tP is applied to the word line WL1, causing the transistor T22 to be tuned on. According to this timing, a voltage of 0V is applied to the bit line BL1. In this way, a write voltage for writing data "0" is applied to the memory cell M222, causing the resistance variable layer in the memory cell M222 to be turned to the low-resistance state. That is, the data "0" is written to the memory cell M222.

In a readout cycle for the memory cell M211, a predetermined voltage for turning on the transistor T11 is applied to the word line WL0, and according to the timing, a pulse voltage having an amplitude smaller than that of the pulse width for writing is applied to the bit line BL0. Thereby, a current corresponding to the resistance value of the resistance variable layer of the memory cell M211 turned to the high-resistance state is output, and its output current value is detected, so that the data "1" is read out.

In a readout cycle for the memory cell M222, a voltage identical to that in the previous readout cycle for the memory cell M211 is applied to the word line WL1 and the bit line BL1. Thereby, a current corresponding to the resistance value of the resistance variable layer of the memory cell M222 turned to the low-resistance state is output, and its output current value is detected, so that the data "0" is read out.

As in Embodiment 2, in this embodiment, a write operation is carried out by using a high-speed pulse.

As already described in Embodiment 2, by using the resistance variable layer comprising the tantalum oxide of the present invention, the nonvolatile memory element which has a low imprinting characteristic can be attained. This eliminates a need for a step such as a delete cycle or a reset cycle in the nonvolatile memory apparatus according to Embodiment 3. This contributes to achievement of a higher-speed writing. In addition, a write operation can be performed with a simple step.

Since a voltage which is as low as 2 to 3V is sufficient as the write voltage, low electric power consumption can be realized.

As already described in Embodiment 2, in this embodiment, redundant aid memory cells and memory cells for parity bits for error correction may be provided additionally. In that case, as these memory cells, the nonvolatile memory elements of the present invention may be used.

Embodiment 4

A nonvolatile semiconductor apparatus according to Embodiment 4 is a nonvolatile semiconductor apparatus which includes the nonvolatile memory element according to Embodiment 1 having a programming function and a logic circuit for executing predetermined calculation.

[Configuration of Nonvolatile Semiconductor Apparatus]

Figure 29:
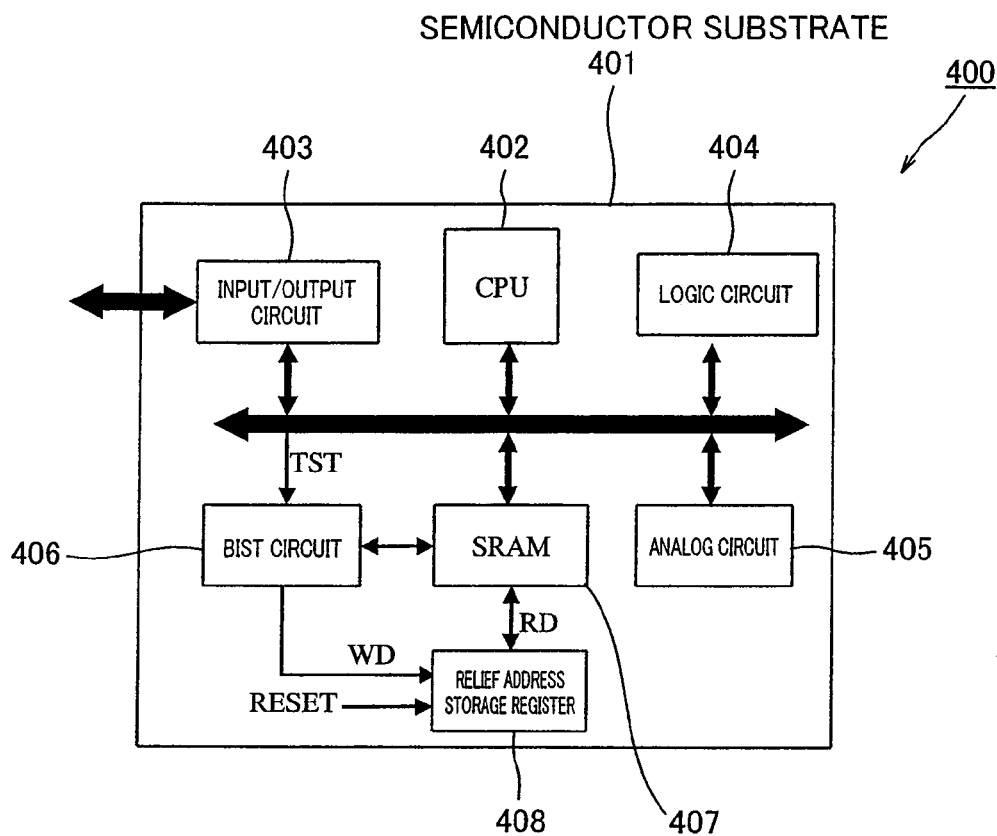
FIG. 29 is a block diagram showing a configuration of a nonvolatile semiconductor apparatus according to Embodiment 4 of the present invention.

FIG. 29 is a block diagram showing a configuration of a nonvolatile semiconductor apparatus according to Embodiment 4 of the present invention.

As shown in FIG. 29, a nonvolatile semiconductor apparatus 400 according to this embodiment includes, on a semiconductor substrate 401, a CPU 402, an input/output circuit 403 for inputting/outputting data to/from an external circuit, a logic circuit 404 for executing predetermined calculation, an analog circuit 405 for processing an analog signal, a BIST (Built In Self Test) circuit 406 for performing self diagnosis, a SRAM 407, and a relief address storage register 408 which is connected to the BIST circuit 406 and to the SRAM 407 and is configured to store specific address data.

Figure 30:
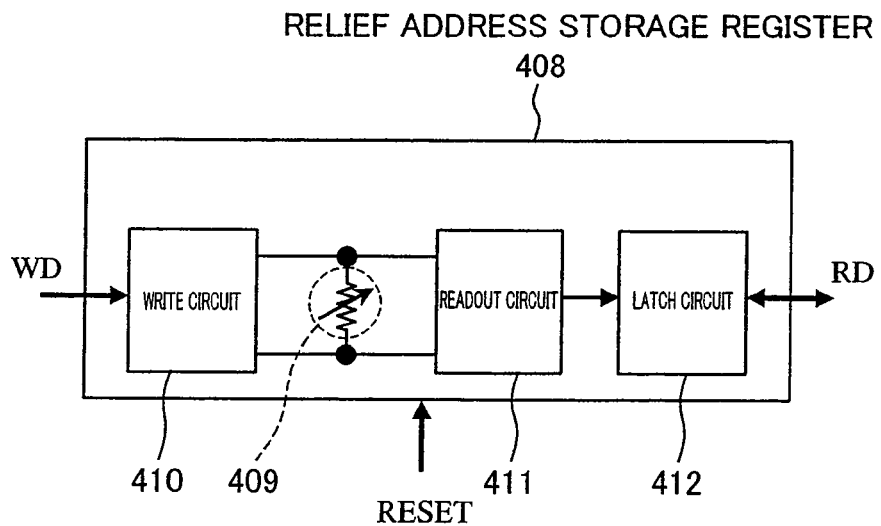
FIG. 30 is a block diagram showing a configuration of a relief address storage register included in the nonvolatile semiconductor apparatus according to Embodiment 4 of the present invention.
Figure 31:
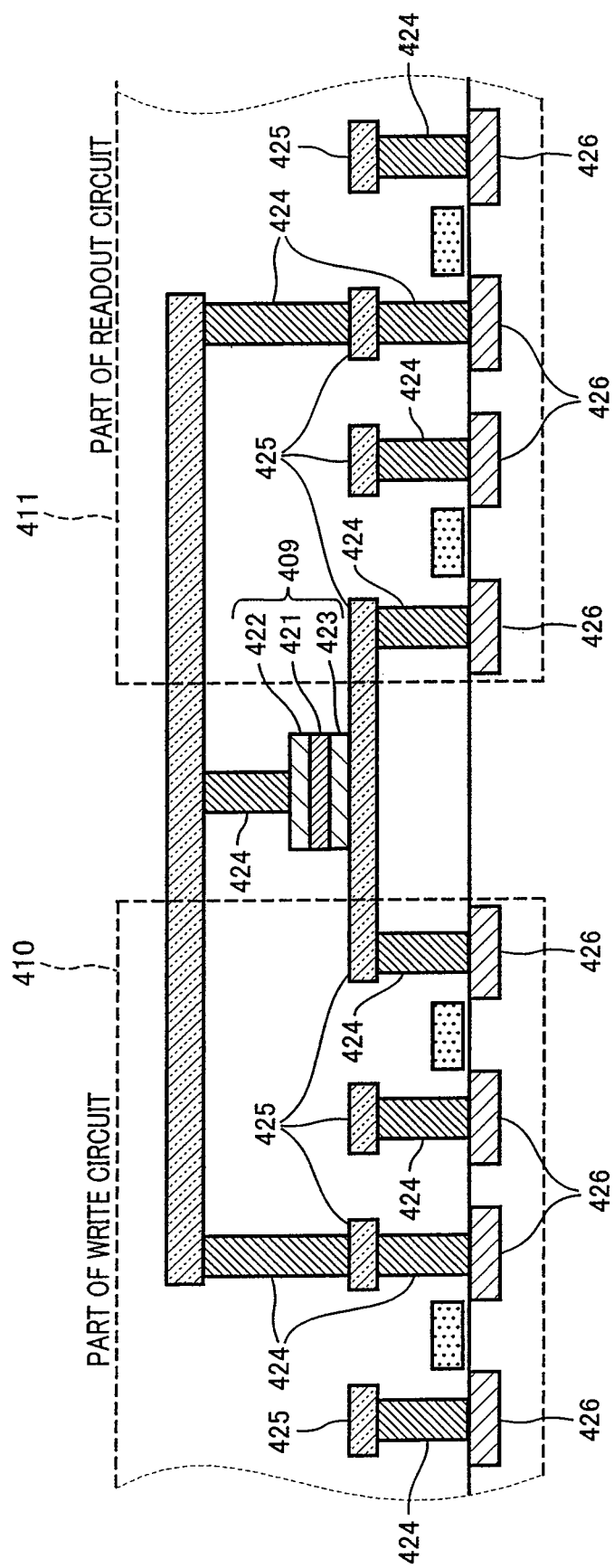
FIG. 31 is a cross-sectional view showing a configuration of the relief address storage register included in the nonvolatile semiconductor apparatus according to Embodiment 4 of the present invention.

FIG. 30 is a block diagram showing a configuration of a relief address storage register included in the nonvolatile semiconductor apparatus according to Embodiment 4 of the present invention. FIG. 31 is a cross-sectional view showing a configuration of the relief address storage register.

As shown in FIGS. 30 and 31, the relief address storage register 408 includes a nonvolatile memory element 409 corresponding to the nonvolatile memory element according to Embodiment 1, a write circuit 410 for writing specific address data to the nonvolatile memory element 409, a readout circuit 411 for reading out the address data written in the nonvolatile memory element 409, and a latch circuit 412.

The nonvolatile memory element 409 is connected to a switch portion to the write circuit 410 side and a switch portion to the readout circuit 411 side, and has a structure in which the resistance variable layer 421 is sandwiched between the upper electrode 422 and the lower electrode 423. The nonvolatile memory element 409 corresponds to the nonvolatile memory element according to Embodiment 1.

In FIG. 31, 424 denotes a plug layer, 425 denotes a metal wire layer, and 426 denotes a source/drain layer.

Whereas in this embodiment, two-layer wires are provided and the nonvolatile memory element is provided between the first wire and the second wire, multi-layer wires of three or more layers may alternately be provided and the nonvolatile memory element may be disposed between desired wires. In further alternative, the nonvolatile memory element may be disposed between a plurality of wires as desired.

[Example of Operation of Nonvolatile Semiconductor Apparatus]

Subsequently, an example of the operation of nonvolatile semiconductor apparatus according to this embodiment configured as described above will be described.

Hereinafter, a case where the address data is written to the relief address storage register 408 will be described. The BIST circuit 406 inspects a memory block in the SRAM 407, when receiving a diagnosis command signal TST.

The memory block is inspected during inspection in a manufacturing process of LSI, and during various diagnostic processes carried out in the case where the LSI is mounted to an actual system.

If a faulty bit is detected as a result of inspection of the memory block, the BIST circuit 406 outputs write data command signal WD to the relief address storage register 408. Receiving the write data command signal WD, the relief address storage register 408 stores address data corresponding to the faulty bit therein.

The address data is stored by changing the resistance state of the resistance variable layer in the associated register to the high-resistance state or to the low-resistance state, according to the address data. The resistance variable layer is changed to the high-resistance state or to the low-resistance state as in Embodiment 1.

In this way, the address data is written to the relief address storage register 408. Upon the SRAM 407 being accessed, the address data written in the relief address storage register 408 is read out. The address data is read out by detecting an output current value corresponding to the resistance state of the resistance variable layer as in Embodiment 1.

When the address data read out from the relief address storage register 408 matches the address data of an access target, a backup redundant memory cell provided in the SRAM 407 is accessed, so that data is read out or written.

The self diagnosis performed as described above eliminates a need for an expensive LSI tester provided externally, in inspection in the manufacturing process. In addition, the self diagnosis makes it possible to advantageously conduct at Speed test. Furthermore, since faulty bits can be aided after a lapse of time as well as in the inspection, a high quality can be advantageously kept for a long period of time.

The nonvolatile semiconductor apparatus according to this embodiment is applicable to a case where data is written only once in the manufacturing process and to a case where data is rewritten repeatedly after shipment of products.

[Method of Manufacturing Nonvolatile Semiconductor Apparatus]

Subsequently, a manufacturing method of the nonvolatile semiconductor apparatus according to this embodiment configured as described above will be described.

Figure 32:
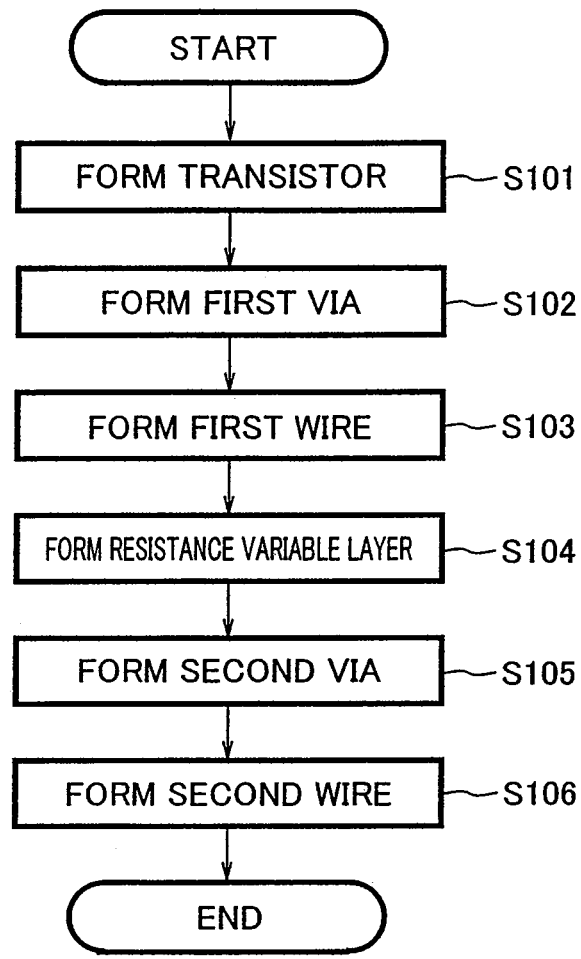
FIG. 32 is a flowchart showing a main flow of a manufacturing process of the nonvolatile semiconductor apparatus according to Embodiment 4 of the present invention.
Figure 33:
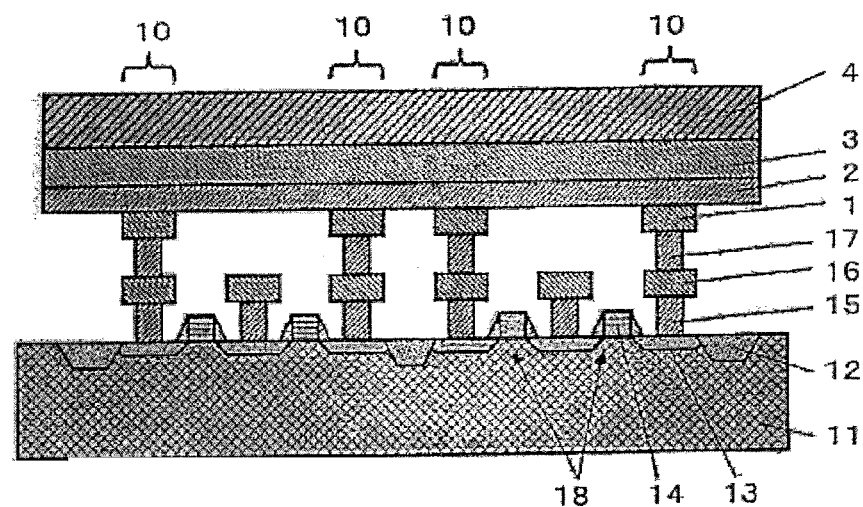
FIG. 33 is a cross-sectional view showing a configuration of a conventional memory element.

FIG. 32 is a flowchart showing a main flow of a manufacturing process of the nonvolatile semiconductor apparatus according to Embodiment 4 of the present invention.

Initially, a transistor is formed on the semiconductor substrate (S101). Then, a first via is formed (S102), and a first wire is formed thereon (S103).

Then, the resistance variable layer is formed on the first wire formed in S103 (S104). The resistance variable layer is formed as described in Embodiment 1.

Then, a second via is formed on the resistance variable layer (S105), and further, a second wire is formed thereon (S106).

As described above, the manufacturing method of the nonvolatile semiconductor apparatus of this embodiment is such that the step of forming the electrodes and the resistance variable layer is added to the manufacturing process of the CMOS process. Therefore, the nonvolatile semiconductor apparatus can be easily manufactured by utilizing the existing CMOS process. In addition, since additional steps are fewer and the film thickness of the resistance variable layer is relatively small, the time of the process can be shortened.

As in Embodiment 2, the resistance variable layer of the present invention can be formed at a low temperature. Therefore, it is advantageous that transistors or wire material such as silicide formed in a lower layer step are not affected even when forming a layered structure is performed in a wiring step illustrated in this embodiment.

Since the electrode portion can be formed with 1 μm square or smaller and other circuits can be formed in the CMOS process, a small-sized nonvolatile switch circuit can be easily attained.

Instead of using the nonvolatile memory element including the resistance variable layer comprising tantalum oxide in Embodiment 1, the nonvolatile semiconductor apparatus might be attained by using a known flash memory nonvolatile memory element or a known FeRAM memory nonvolatile memory element. In these cases, however, a special process step and material become necessary, which makes it difficult that these memory elements have affinity with the CMOS process. For this reason, a cost problem arises, and the manufacturing steps significantly increases, which is not practical. Further, a problem arises, that these memory elements are difficult to use as the programming element, because writing and reading out of data are complicated in these memory elements.

As a configuration which has high affinity with the CMOS process, there is provided a memory cell called a CMOS nonvolatile memory cell, which operates equivalently to the flash memory cell by floating the gate wires in the CMOS process. However, such a configuration arises problems that area of the element portion increases and control of its operation is complicated.

The configuration using an electric fuse element such as a silicide fusing element may have high affinity with the CMOS process. In this case, problems that rewrite of the data cannot be performed, and area of the electrode portion increases arise.

The wires may be trimmed by a known laser. In this case, miniaturization is constrained by a mechanical precision of a laser trimmer, which is limited only in a manufacturing process, and therefore cannot be realized. Or, there is a limitation on layout, because the wires must be positioned as an uppermost layer.

Whereas the nonvolatile memory element in Embodiment 1 is used as the relief address storage register of the SRAM, the following examples may be alternatively used. For example, the nonvolatile memory element in Embodiment 1 may be used as the relief address storage register for faulty bits in DRAM, ROM, or the nonvolatile memory apparatuses according to Embodiment 2 and Embodiment 3.

The nonvolatile memory element may be applied to a nonvolatile switch for switching a faulty logic circuit or a backup logic circuit. Furthermore, the nonvolatile memory element may be used as a register for adjusting a voltage in an analog circuit and for adjusting timing in the analog circuit, a register for modifying a ROM which is a product, a nonvolatile switch element for reconfigurable logic and EPGA, and a nonvolatile register.

Other Embodiment

The nonvolatile semiconductor apparatus according to Embodiment 4 may be configured to include the nonvolatile memory apparatus according to Embodiment 2, that is, to integrate on one semiconductor substrate, the cross-point type nonvolatile memory apparatus according to Embodiment 2 and the LSI having the CPU according to Embodiment 4.

In this case, the cross-point type nonvolatile memory apparatus according to Embodiment 2 and the LSI having the CPU according to Embodiment 4 are formed on different semiconductor substrates, and thereafter may be molded into one package.

The nonvolatile semiconductor apparatus according to Embodiment 4 may be configured to include the nonvolatile memory apparatus according to Embodiment 3, that is, to integrate on one semiconductor substrate the nonvolatile memory apparatus having the one transistor/one nonvolatile memory portion configuration according to Embodiment 3 and the LSI having the CPU according to Embodiment 4.

The nonvolatile memory apparatus having the one transistor/one nonvolatile memory portion configuration according to Embodiment 3 and the LSI having the CPU according to Embodiment 4 are formed on different semiconductor substrates, and thereafter may be molded into one package.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention.

INDUSTRIAL APPLICABILITY

A nonvolatile memory element, a nonvolatile memory apparatus, and a nonvolatile semiconductor apparatus of the present invention are capable of high-speed operation and has a stable rewrite characteristic, and are useful as nonvolatile memory elements, and others which are used in various electronic devices such as digital home electric appliances, memory cards, cellular phones, and personal computers.

A manufacturing method of the nonvolatile memory element of the present invention is useful as a manufacturing method of the nonvolatile memory element which is capable of high-speed operation and has a stable rewrite characteristic, and is used in various electronic devices such as digital home electric appliances, memory cards, cellular phones, and personal computers.

The invention claimed is:

1. A nonvolatile memory apparatus comprising:
   a memory cell including a first electrode, a second electrode, and a resistance variable layer disposed between the first electrode and the second electrode; and
   a power supply driver circuit configured to apply a first voltage signal of positive polarity for a first data and a second voltage signal of negative polarity for a second data different from the first data, to the second electrode, the polarity being determined based on the voltage of the first electrode as a reference voltage, an absolute value of the first voltage signal being different from an absolute value of the second voltage signal,
   wherein the resistance variable layer comprises at least a tantalum oxide that satisfies $0.8 \leq x \leq 1.9$ when the tantalum oxide is represented by $TaO_x$, a resistance value of the resistance variable layer varying reversibly according to the voltage signal applied by the power supply driver circuit.

2. The nonvolatile memory apparatus according to claim 1, wherein at least one of the first electrode and the second electrode comprises at least one material selected from a group consisting of Pt, Ir, Cu, Au, Ag, TiN, and TiAlN.

3. A nonvolatile memory apparatus comprising:
   a semiconductor substrate; and
   a memory array including:
      a plurality of first electrode wires formed on the semiconductor substrate to extend in parallel with each other;
      a plurality of second electrode wires formed above the plurality of first electrode wires so as to extend in parallel with each other within a plane parallel to a main surface of the semiconductor substrate and so as to three-dimensionally cross the plurality of first electrode wires;
   a power supply driver circuit configured to apply a first voltage signal of positive polarity for a first data and a second voltage signal of negative polarity for a second data different from the first data, through the second electrode wire, the polarity being determined based on the voltage applied through the first electrode wire as a reference voltage, and an absolute value of the first voltage signal being different from an absolute value of the second voltage signal; and
   nonvolatile memory elements provided to respectively correspond to three-dimensional cross points of the plurality of first electrode wires and the plurality of second electrode wires,
   wherein each of the nonvolatile memory elements includes a resistance variable layer disposed between an associated one of the first electrode wires and an associated one of the second electrode wires, comprising at least a tantalum oxide that satisfies $0.8 \leq x \leq 1.9$ when the tantalum oxide is represented by $TaO_x$, a resistance value of the resistance variable layer varying reversibly according to the voltage signal applied by the power supply driver circuit.

4. The nonvolatile memory apparatus according to claim 3, wherein
   each of the nonvolatile memory elements includes a first electrode connected to the first electrode wire, a second electrode connected to the second electrode wire, and the resistance variable layer disposed between the first electrode and the second electrode.

5. The nonvolatile memory apparatus according to claim 4, wherein:
   each of the nonvolatile memory elements includes a current restricting element provided between the first electrode and the second electrode, and
   the current restricting element is electrically connected to the resistance variable layer.

6. The nonvolatile memory apparatus according to claim 3, comprising a multi-layer memory array including a plurality of memory arrays stacked.

7. A nonvolatile memory apparatus comprising:
   a semiconductor substrate; and
   a plurality of word lines and a plurality of bit lines which are formed on the semiconductor substrate and are arranged to cross each other;
   a plurality of transistors provided to respectively correspond to intersections of the plurality of word lines and the plurality of bit lines;
   a plurality of nonvolatile memory elements provided to respectively correspond to the plurality of transistors, wherein:
   each of the nonvolatile memory elements includes:
      a first electrode;
      a second electrode;
      a power supply driver circuit configured to apply a first voltage signal of positive polarity for a first data to the second electrode, and a second voltage signal of negative polarity for a second data different from the first data, the polarity being determined based on the voltage of the first electrode as a reference voltage, and an absolute value of the first voltage signal being different from an absolute value of the second voltage signal; and
      a resistance variable layer which is disposed between the first electrode and the second electrode, comprising at least a tantalum oxide that satisfies $0.8 \leq x \leq 1.9$ when the tantalum oxide is represented by $TaO_x$, a resistance value of the resistance variable layer varying reversibly according to the voltage signal applied by the power supply driver circuit.

8. A nonvolatile semiconductor apparatus comprising:
   a semiconductor substrate;
   a logic circuit formed on the semiconductor substrate, for executing predetermined calculation; and
   a nonvolatile memory element formed on the semiconductor substrate and having a programming function, wherein:
   the nonvolatile memory element includes:
      a first electrode;
      a second electrode;

a power supply driver circuit configured to apply a first voltage signal of positive polarity for a first data and a second voltage signal of negative polarity for a second data different from the first data, the polarity being determined based on the voltage of the first electrode as a reference voltage, and an absolute value of the first voltage signal being different from an absolute value of the second voltage signal; and a resistance variable layer disposed between the first electrode and the second electrode, comprising at least a tantalum oxide that satisfies $0.8 \leq x \leq 1.9$ when the tantalum oxide is represented by $TaO_x$, a resistance value of the resistance variable layer varying reversibly according to the voltage signal applied by the power supply driver circuit.

9. The nonvolatile memory apparatus according to claim 3, wherein at least one of the first electrode and the second electrode comprises at least one material selected from a group consisting of Pt, Ir, Cu, Au, Ag, TiN, and TiAlN.

10. The nonvolatile semiconductor apparatus according to claim 8, wherein at least one of the first electrode and the second electrode comprises at least one material selected from a group consisting of Pt, Ir, Cu, Au, Ag, TiN, and TiAlN.

11. The nonvolatile memory apparatus according to claim 1, wherein the power supply driver circuit is configured to apply a pulse voltage as the voltage signal.

12. A method of operating a nonvolatile memory apparatus, the nonvolatile memory apparatus comprising a memory cell including a first electrode, a second electrode, and a resistance variable layer disposed between the first electrode and the second electrode, the resistance variable layer comprising a tantalum oxide that satisfies $0.8 \leq x \leq 1.9$ when the tantalum oxide is represented by $TaO_x$, the method comprising steps of:

writing a first data into the memory cell by applying a first voltage signal of positive polarity to the second electrode; and writing a second data into the memory cell by applying a second voltage signal of negative polarity to the second electrode, the second data being different from the first data, wherein:

the polarity is determined based on a voltage of the first electrode as a reference voltage, and an absolute value of the first voltage signal is different from an absolute value of the second voltage signal.

13. The method of claim 12, wherein the absolute value of the first voltage signal is smaller than the absolute value of the second voltage signal.

14. The method of claim 12, further comprising a step of reading data from the memory cell by applying a third voltage signal, wherein an absolute value of the third voltage signal is smaller than an absolute value of the first voltage signal and an absolute value of the second voltage signal.

15. The nonvolatile memory apparatus according to claim 1, wherein an oxygen content of the tantalum oxide at a position closer to at least one of the first and second electrodes is higher than an oxygen content of the tantalum oxide at a center position of the tantalum oxide.

16. The nonvolatile memory apparatus according to claim 3, wherein an oxygen content of the tantalum oxide at a position closer to at least one of the first and second electrodes is higher than an oxygen content of the tantalum oxide at a center position of the tantalum oxide.

17. The nonvolatile memory apparatus according to claim 7, wherein an oxygen content of the tantalum oxide at a position closer to at least one of the first and second electrodes is higher than an oxygen content of the tantalum oxide at a center position of the tantalum oxide.

18. The nonvolatile memory apparatus according to claim 8, wherein an oxygen content of the tantalum oxide at a position closer to at least one of the first and second electrodes is higher than an oxygen content of the tantalum oxide at a center position of the tantalum oxide.

19. The method of claim 12, wherein an oxygen content of the tantalum oxide at a position closer to at least one of the first and second electrodes is higher than an oxygen content of the tantalum oxide at a center position of the tantalum oxide.

20. The nonvolatile memory apparatus according to claim 1, wherein the tantalum oxide is amorphous.

21. The nonvolatile memory apparatus according to claim 3, wherein the tantalum oxide is amorphous.

22. The nonvolatile memory apparatus according to claim 7, wherein the tantalum oxide is amorphous.

23. The nonvolatile memory apparatus according to claim 8, wherein the tantalum oxide is amorphous.

24. The method of claim 12, wherein the tantalum oxide is amorphous.

25. The nonvolatile memory apparatus according to claim 7, wherein at least one of the first electrode and the second electrode comprises at least one material selected from a group consisting of Pt, Ir, Cu, Au, Ag, TiN, and TiAlN.

* * * * *